United States Patent
Liao

(10) Patent No.: US 10,706,510 B2
(45) Date of Patent: Jul. 7, 2020

(54) SYSTEMS AND METHODS FOR PHASE UNWRAPPING

(71) Applicant: SHANGHAI UNITED IMAGING HEALTHCARE CO., LTD., Shanghai (CN)

(72) Inventor: Kangjia Liao, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 176 days.

(21) Appl. No.: 16/033,587

(22) Filed: Jul. 12, 2018

(65) Prior Publication Data

US 2019/0019275 A1    Jan. 17, 2019

(30) Foreign Application Priority Data

Jul. 12, 2017    (CN) .......................... 2017 1 0567035

(51) Int. Cl.
| | | |
|---|---|---|
| G06K 9/40 | (2006.01) | |
| G06K 9/36 | (2006.01) | |
| G06T 5/00 | (2006.01) | |
| G01R 33/20 | (2006.01) | |
| G06T 5/50 | (2006.01) | |
| G01R 33/565 | (2006.01) | |

(52) U.S. Cl.
CPC .............. *G06T 5/005* (2013.01); *G01R 33/20* (2013.01); *G01R 33/565* (2013.01); *G06T 5/50* (2013.01); *G06T 2207/10088* (2013.01)

(58) Field of Classification Search
None
See application file for complete search history.

(56) References Cited

U.S. PATENT DOCUMENTS

| | | | | |
|---|---|---|---|---|
| 6,630,827 B1 * | 10/2003 | Miyoshi | .............. | G01R 33/565 324/307 |
| 2003/0060697 A1 * | 3/2003 | Zhang | .................... | A61B 5/055 600/410 |

(Continued)

OTHER PUBLICATIONS

Ongori et al., "3D Phase Unwrapping of DENSE MRI Images Using Region Merging", (Year: 2009).*

(Continued)

*Primary Examiner* — Randolph I Chu
(74) *Attorney, Agent, or Firm* — Metis IP LLC

(57) ABSTRACT

A method for phase unwrapping is provided. The method may include obtaining an initial phase image including a plurality of phase elements. At least one of the phase elements may be wrapped. The method may also include generating a phase mask by preprocessing the initial phase image based on phase differences between the plurality of phase elements. The method may also include generating at least two segmental phase images by segmenting the initial phase image along at least two directions based on the phase mask. The method may further include generating at least two intermediate phase images by performing phase unwrapping on each of the at least two segmental phase images, respectively. The method may further include determining an unwrapped phase image corresponding to the initial phase image based on the at least two intermediate phase images.

20 Claims, 14 Drawing Sheets

(56) References Cited

U.S. PATENT DOCUMENTS

2014/0210467 A1* 7/2014 Hwang .............. G01R 33/5602
   324/309
2020/0054235 A1* 2/2020 Beckers ............... A61B 5/7257

OTHER PUBLICATIONS

Jenkinson, A Fast, Automated, N-Dimensional Phase Unwrapping Algorithm, FMRIB Technical Report (Year: 2003).*

Robinson et al., "A Method for Unwrapping Highly Wrapped Multi-echo Phase Images at Very High Field: UMPIRE", Magn Reson Med. Jul. 2014 (Year: 2014).*

Bromiley et al., "A fast, model-independent method for cerebral cortical thickness estimation using MRI", Medical Image Analysis 13 (2009) 269-285 (Year: 2009).*

Szczypinski et al., "A model of deformable rings for interpretation of wireless capsule endoscopic videos", Medical Image Analysis 13 (2009) 312-324 (Year: 2009).*

Robinson et al., "An illustrated comparison of processing methods for MR phase imaging and QSM: combining array coil signals and phase unwrapping", NMR in Biomedicine, Sep. 13, 2016 (Year: 2016).*

Zhang et al., "An Improved Quality Guided Phase Unwrapping Method and Its Applications to MRI", Progress In Electromagnetics Research, vol. 145, 273{286, 2014 (Year: 2014).*

Langley, "Estimation of the Phase Gradient in MRI: From Phase Unwrapping to Characterization of Magnetic Field Maps", The University of Georgia (Year: 2011).*

Lan, "Phase Unwrapping and Background Correction in MRI", IEEE Xplore (Year: 2008).*

Zhou et al. "Reliable Two-Dimensional Phase Unwrapping Method Using Region Growing and Local Linear Estimation", Magnetic Resonance in Medicine 62:1085-1090 (2009) (Year: 2009).*

Gonzalez et al., "Robust Phase Unwrapping by Convex Optimization" arXiv (Year: 2014).*

Tan et al. "A Simple, Fast, and Robust Phase Unwrapping Method to Unwrap MR Phase Images", 4th Kuala Lumpur International Conference on Biomedical Engineering 2008 pp. 487-490 (Year: 2008).*

Chavez et al., "Understanding Phase Maps in MRI: A New Cutline Phase Unwrapping Method", IEEE Transactions on Medical Imaging, vol. 21, No. 8, Aug. 2002 (Year: 2002).*

* cited by examiner

700

---

Generating at least two initial unwrapped images corresponding to the at least two segmental phase images by performing phase unwrapping on the at least two segmental phase images, respectively — 701

Determining a set of optimized coefficients for each initial unwrapped image based on a condition associated with a difference between the at least two initial unwrapped images — 703

Determining at least two intermediate phase images based on the set of optimized coefficients and the at least two initial unwrapped images — 705

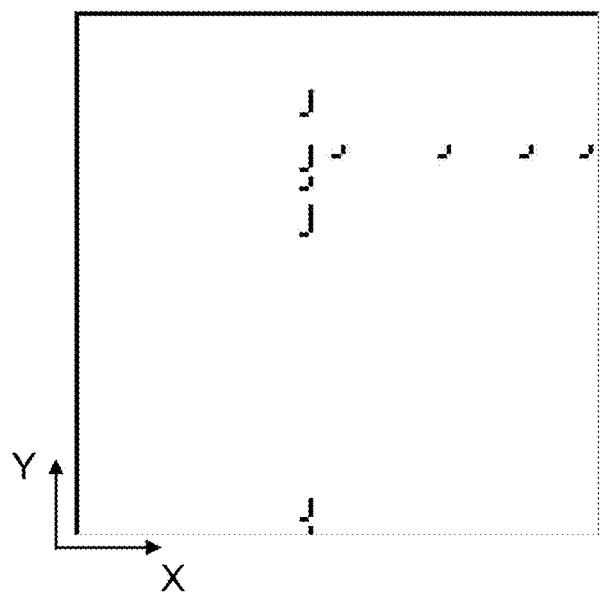
FIG. 14
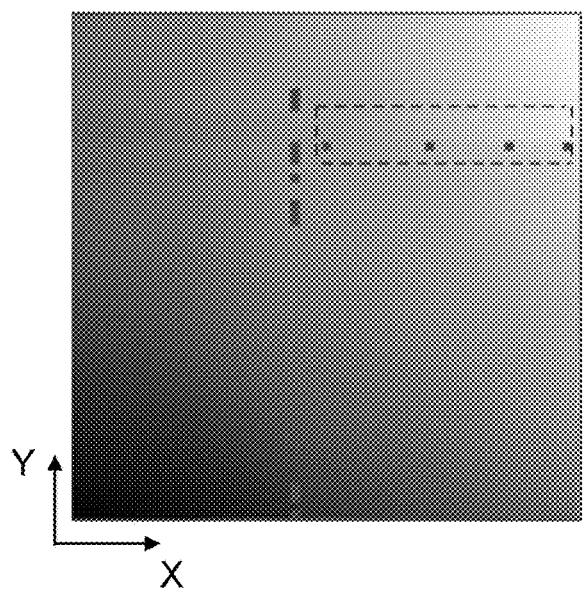 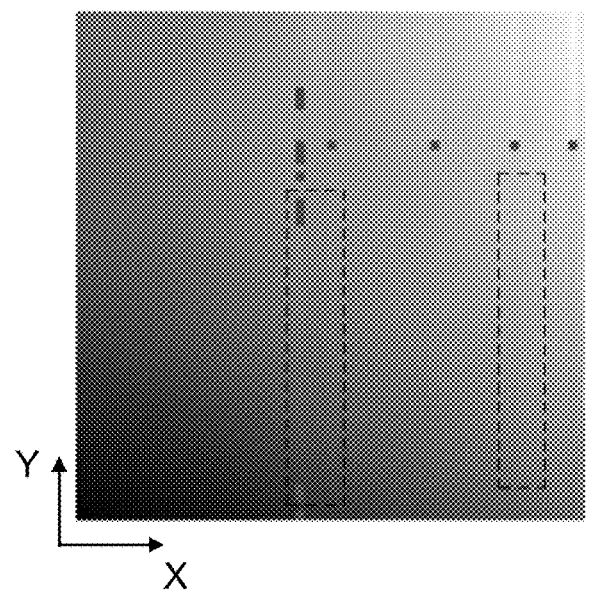
FIG. 15A  FIG. 15B

SYSTEMS AND METHODS FOR PHASE UNWRAPPING

CROSS-REFERENCE TO RELATED APPLICATIONS

This application claims priority to Chinese Patent Application No. 201710567035.7, filed on Jul. 12, 2017, the contents of which are hereby incorporated by reference in its entirety.

TECHNICAL FIELD

The present disclosure generally relates to image processing, and more specifically relates to systems and methods for phase unwrapping in image processing in magnetic resonance imaging (MRI).

BACKGROUND

Magnetic resonance imaging (MRI) techniques are widely used in clinical examinations and medical diagnoses in recent years. For example, an MRI scanner may perform a scan on a subject located within its detection region and generate magnetic resonance (MR) signals relating to the subject. A phase image may be generated by extracting phase information from the MR signals. In general, the phase image can reflect multiple physical information, for example, a distribution of a magnetic field, the current state of an MRI system, etc. In some embodiments, the phase image may be generated based on, for example, an inverse trigonometric function. Accordingly, the phase information may be limited within a range of $2\pi$, for example, $(-\pi, \pi]$, $(0, 2\pi]$, etc. If an actual phase exceeds this range, the actual phase may be wrapped into the range, which is called "phase wrapping." A phase image generated according to the wrapped phase information may have a wrapping artifact. Thus, it is desirable to reduce or eliminate phase wrapping in a phase image to improve the quality of the phase image.

SUMMARY

In one aspect of the present disclosure, a system for phase unwrapping in magnetic resonance imaging (MRI) is provided. The system may include at least one storage device, and at least one processor in communication with the storage device. The at least one storage device may store a set of instructions. When executing the set of instructions, the at least one processor may be configured to cause the system to obtain an initial phase image including a plurality of phase elements. At least one of the plurality of phase elements may be wrapped. The at least one processor may also be configured to cause the system to generate a phase mask corresponding to the initial phase image by preprocessing the initial phase image based on phase differences between the plurality of phase elements. The phase mask may include one or more elements corresponding to one or more residual pixels or one or more non-residual pixels of the initial phase image. The at least one processor may also be configured to cause the system to generate at least two segmental phase images by segmenting the initial phase image along at least two directions based on the phase mask. The at least one processor may be further configured to cause the system to generate at least two intermediate phase images by performing phase unwrapping on each of the at least two segmental phase images, respectively. Phase unwrapping of each segmental phase image may be performed along one direction. The at least one processor may be further configured to cause the system to determine an unwrapped phase image corresponding to the initial phase image based on the at least two intermediate phase images.

In some embodiments, to generate a phase mask corresponding to the initial phase image by preprocessing the initial phase image, the at least one processor may be further configured to cause the system to determine a plurality of residual values for the plurality of phase elements. Each residual value may correspond to a phase element and relate to one or more phase differences between the phase element and one or more phase elements next to the phase element. The at least one processor may be further configured to cause the system to determine the one or more residual pixels based on the plurality of residual values, and generate the phase mask corresponding to the initial phase image based on the one or more residual pixels.

In some embodiments, to determine the one or more residual pixels based on the plurality of residual values, the at least one processor may be further configured to cause the system to designate a candidate phase element next to a determined residual pixel as a residual pixel. The candidate phase element may be a phase element that is involved in a determination of the residual value of the determined residual pixel.

In some embodiments, to generate a phase mask corresponding to the initial phase image by preprocessing the initial phase image, the at least one processor may be further configured to cause the system to obtain an amplitude image corresponding to the initial phase image. The amplitude image may include a plurality of amplitude elements. Each amplitude element of the amplitude image may correspond to a pixel or voxel and have an amplitude value. Each amplitude element of the amplitude image may correspond to a phase element of the initial phase image. The at least one processor may be further configured to cause the system to determine one or more background amplitude elements from the amplitude image. An amplitude value of each background amplitude element may be lower than a threshold. The at least one processor may be further configured to cause the system to update the initial phase image by designating phase values of one or more phase elements corresponding to the determined one or more background amplitude elements as 0.

In some embodiments, to generate at least two intermediate phase images by performing phase unwrapping on each of the at least two segmental phase images, the at least one processor may be further configured to cause the system to generate at least two initial unwrapped images corresponding to the at least two segmental phase images by performing phase unwrapping on the at least two segmental phase images, respectively. The at least one processor may be further configured to cause the system to determine a set of optimized coefficients for each initial unwrapped image based on a condition associated with a difference between the at least two initial unwrapped images. The at least one processor may be further configured to cause the system to determine the at least two intermediate phase images based on the set of optimized coefficients and the at least two initial unwrapped images.

In some embodiments, to determine a set of optimized coefficients for each initial unwrapped image, the at least one processor may be further configured to cause the system to set a set of initial coefficients for the each initial unwrapped image, and determine the set of optimized coefficients for the each initial unwrapped image by minimizing the difference between the at least two initial unwrapped images based on the set of initial coefficients of the each initial unwrapped image.

In some embodiments, to determine an unwrapped phase image corresponding to the initial phase image based on the at least two intermediate phase images, the at least one processor may be further configured to cause the system to determine that the at least two intermediate phase images do not have a defect relating to the one or more residual pixels. In response to a determination that the at least two intermediate phase images do not have a defect relating to the one or more residual pixels, the at least one processor may be configured to cause the system to designate one of the at least two intermediate phase images as the unwrapped phase image.

In some embodiments, to determine an unwrapped phase image corresponding to the initial phase image based on the at least two intermediate phase images, the at least one processor may be further configured to cause the system to determine that at least one of the at least two intermediate phase images has a defect relating to the one or more residual pixels. In response to a determination that at least one of the at least two intermediate phase images has a defect relating to at least one of the one or more residual pixels, the at least one processor may be further configured to cause the system to select a first intermediate phase image from the at least two intermediate phase images, and identify a first area including one or more abnormal phase elements with respect to the defect in the first intermediate phase image. The at least one processor may be further configured to cause the system to determine a modified first intermediate phase image by updating the first area with respect to the one or more abnormal phase elements, and designate the modified first intermediate phase image as the unwrapped phase image.

In some embodiments, the defect may be a laddering spreading along a direction of the at least two directions.

In some embodiments, to determine a modified first intermediate phase image by updating the first area with respect to the one or more abnormal phase elements, the at least one processor may be further configured to cause the system to determine the modified first intermediate phase image by replacing the one or more abnormal phase elements in the first area of the first intermediate phase image with one or more corresponding phase elements in a second intermediate phase image of the at least two intermediate phase images.

In some embodiments, the initial phase image may be generated according to magnetic resonance (MR) signals collected by an MRI scanner.

In some embodiments, the at least one processor may be further configured to cause the system to determine a distribution of a magnetic field in a detection region of the MRI scanner based on the unwrapped phase image.

In some embodiments, the at least two directions may include a phase encoding direction and a frequency encoding direction.

In some embodiments, the at least two directions may further include a slice selection direction or a direction corresponding to a time dimension.

In another aspect of the present disclosure, a method for performing phase unwrapping is provided. The method may be implemented on a computing device including a storage device and at least one processor. The method may include obtaining an initial phase image including a plurality of phase elements. At least one of the plurality of phase elements may be wrapped. The method may also include generating a phase mask corresponding to the initial phase image by processing the initial phase image based on phase differences between the plurality of phase elements. The phase mask may include one or more elements corresponding to one or more residual pixels or one or more non-residual pixels of the initial phase image. The method may further include generating at least two segmental phase images by segmenting the initial phase image into a plurality of line-segments based on the phase mask along at least two directions, respectively. The method may further include generating at least two intermediate phase images by performing phase unwrapping on each of the at least two segmental phase images, respectively. Phase unwrapping of each segmental phase image may be performed along one direction. The method may further include determining an unwrapped phase image corresponding to the initial phase image based on the at least two intermediate phase images.

In another aspect of the present disclosure, a non-transitory computer-readable medium is provided. The non-transitory computer-readable medium may include at least one set of instructions. When executed by at least one processor of a computing device, the at least one set of instructions may cause the at least one processor to effectuate a method including obtaining an initial phase image including a plurality of phase elements, at least one of the plurality of phase elements being wrapped. The at least one set of instructions may also cause the at least one processor to effectuate the method including generating a phase mask corresponding to the initial phase image by preprocessing the initial phase image based on phase differences between the plurality of phase elements. The phase mask may include one or more elements corresponding to one or more residual pixels or one or more non-residual pixels of the initial phase image. The at least one set of instructions may also cause the at least one processor to effectuate the method including generating at least two segmental phase images by segmenting the initial phase image along at least two directions based on the phase mask. The at least one set of instructions may also cause the at least one processor to effectuate the method including generating at least two intermediate phase images by performing phase unwrapping on each of the at least two segmental phase images, respectively. Phase unwrapping of each segmental phase image may be performed along one direction. The at least one set of instructions may also cause the at least one processor to effectuate the method including determining an unwrapped phase image corresponding to the initial phase image based on the at least two intermediate phase images.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 7 is a flowchart illustrating an exemplary process for determining at least two intermediate phase images according to some embodiments of the present disclosure;

FIG. 14 shows a binary image illustrating positions of the initial coefficients corresponding to the two initial unwrapped images shown in FIGS. 13A and 13B;

FIGS. 15A and 15B show two intermediate phase images according to some embodiments of the present disclosure.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is to describe particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

Figure 2:
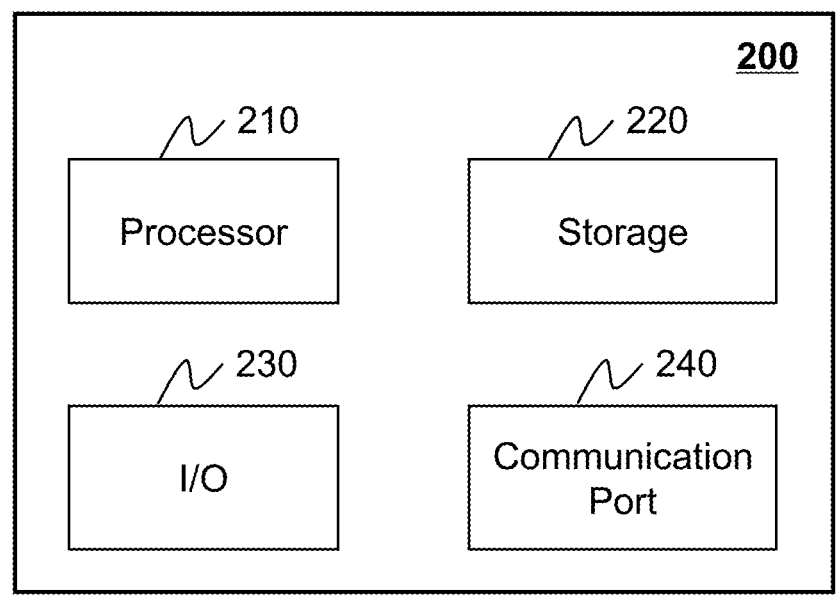
FIG. 2 is a schematic diagram illustrating hardware and/or software components of an exemplary computing device according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 210 as illustrated in FIG. 2 and/or the central processing unit (CPU) 340 illustrated in FIG. 3) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

An aspect of the present disclosure relates to systems and methods for phase unwrapping in magnetic resonance imaging (MRI). To this end, the systems and methods may obtain an initial phase image. The initial phase image may be a 2D or 3D phase image. The systems and methods may generate a phase mask by preprocessing the initial phase image. The phase mask may include one or more elements corresponding to residual pixels of the initial phase image. Such residual pixels may be introduced into the initial phase image in the generation of the initial phase image due to noises or large local phase gradients, and do not participate in phase unwrapping, which may enhance the stability and reliability of the phase unwrapping. The systems and methods may generate at least two segmental phase images by segmenting the initial phase image along at least two directions based on the phase mask. One direction may correspond to a phase encoding direction, and the other direction may correspond to a frequency encoding direction. The systems and methods may further generate at least two intermediate phase images by performing phase unwrapping on each of the at least two segmental phase images, respectively. The phase unwrapping of one of the segmental phase images may be performed along the phase encoding direction, and the phase unwrapping of another segmental phase image may be performed along the frequency encoding direction. The systems and methods may determine an unwrapped phase image corresponding to the initial phase image based on the at least two intermediate phase images. By performing phase unwrapping based on one-directional segmental phase images, the systems and methods disclosed herein may reduce the multi-directional phase unwrapping to multiple one-directional phase unwrapping, thereby reducing the computational burden or complexity involved in the phase unwrapping.

In some embodiments, the unwrapped phase image may be used to determine a distribution of a magnetic field in a detection region of an MRI scanner. The systems and methods may further generate a uniform magnetic field by adjusting one or more scanning parameters of the MRI scanner based on the distribution of the magnetic field.

The following description is provided with reference to phase unwrapping. This is not intended to limit the scope the present disclosure. For persons having ordinary skills in the art, a certain amount of variations, changes, and/or modifications may be deducted under the guidance of the present disclosure. Those variations, changes, and/or modifications do not depart from the scope of the present disclosure.

Figure 1:
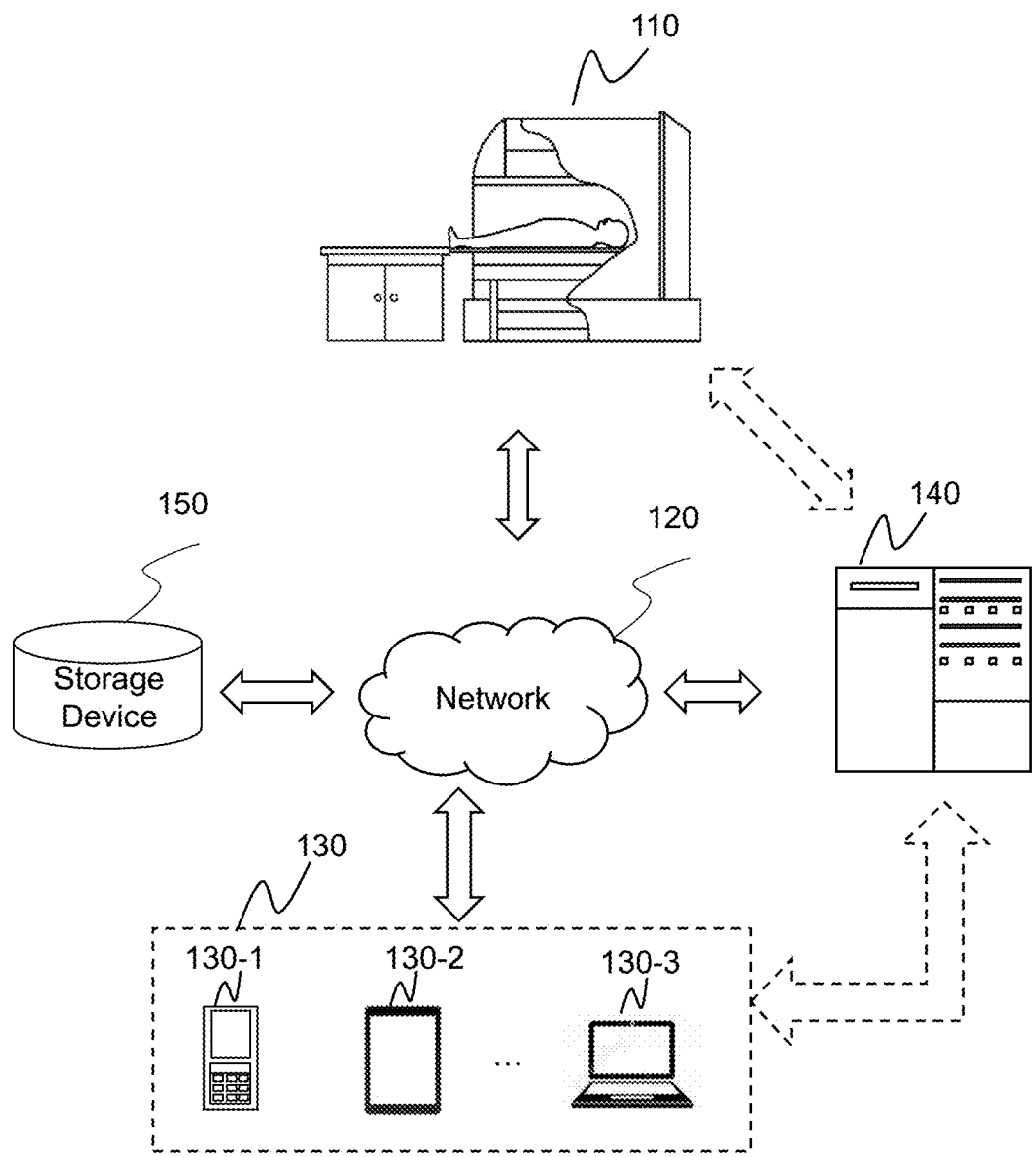
FIG. 1 is a schematic diagram illustrating an exemplary magnetic resonance imaging (MRI) system according to some embodiments of the present disclosure.

FIG. 1 is a schematic diagram illustrating an exemplary magnetic resonance imaging (MRI) system according to some embodiments of the present disclosure. As illustrated, the MRI system 100 may include an MRI scanner 110, a network 120, a terminal 130, a processing device 140, and a storage device 150. The components in the MRI system 100 may be connected in one or more of various ways. Merely by way of example, as illustrated in FIG. 1, the MRI scanner 110 may be connected to the processing device 140 through the network 120. As another example, the MRI scanner 110 may be connected to the processing device 140 directly as indicated by the bi-directional arrow in dotted lines linking the MRI scanner 110 and the processing device 140. As a further example, the storage device 150 may be connected to the processing device 140 directly or through the network 120. As still a further example, the terminal 130 may be connected to the processing device 140 directly (as indicated by the bi-directional arrow in dotted lines linking the terminal 130 and the processing device 140) or through the network 120.

The MRI scanner 110 may scan a subject located within its detection region and generate a plurality of data relating to the subject. In the present disclosure, "subject" and "object" are used interchangeably. The subject may include a biological subject (e.g., a human, an animal), a non-biological subject (e.g., a phantom), etc. The MRI scanner 110 may include a magnet assembly (e.g., a superconducting magnet), a gradient coil assembly, and/or a radiofrequency (RF) coil assembly (not shown in FIG. 1). In some embodiments, the MRI scanner 110 may be a closed-bore scanner or an open-bore scanner.

The magnet assembly may generate a first magnetic field (also referred to as a main magnetic field) for polarizing the subject to be scanned. The magnet assembly may include a permanent magnet, a superconducting magnet, a resistive electromagnet, etc. In some embodiments, the magnet assembly may further include shim coils for maintaining the homogeneity of the main magnetic field.

The gradient coil assembly may generate a second magnetic field (also referred to as a gradient magnetic field). The gradient coil assembly may be designed for either a closed-bore MRI scanner or an open-bore MRI scanner. The gradient coil assembly may include X-gradient coils, Y-gradient coils, and Z-gradient coils. The gradient coil assembly may generate one or more magnetic field gradient pulses to the main magnetic field in the X direction (Gx), the Y direction (Gy), and the Z direction (Gz) to encode the spatial information of the subject. In some embodiments, the X direction may be designated as a frequency encoding direction, and the Y direction may be designated as a phase encoding direction. In some embodiments, Gx may be used for frequency encoding or signal readout, generally referred to as the frequency encoding gradient or the readout gradient. In some embodiments, Gy may be used for phase encoding, generally referred to as the phase encoding gradient. In some embodiments, Gz may be used for slice selection for obtaining 2D k-space data. In some embodiments, Gz may be used for phase encoding for obtaining 3D k-space data.

The RF coil assembly may include a plurality of RF coils. The RF coils may include one or more RF transmit coils and/or one or more RF receiver coils. The RF transmit coil(s) may transmit RF pulses to the subject. Under the coordinated action of the main magnetic field, the gradient magnetic field, and the RF pulses, MR signals relating to the subject may be generated. The RF receiver coil(s) may receive MR signals from the subject. In some embodiments, one or more RF coils may both transmit RF pulses and receive MR signals at different times. In some embodiments, the function, size, type, geometry, position, amount, and/or magnitude of the RF coil(s) may be determined or changed according to one or more specific conditions. For example, according to the difference in function and size, the RF coil(s) may be classified as volume coil(s) and local coil(s). In some embodiments, an RF receiver coil may correspond to a channel. The RF receiver coil(s) may receive a plurality of channels of MR signals from the subject. The received MR signal(s) may be sent to the processing device 140 directly or via the network 120 for image reconstruction and/or image processing.

The network 120 may include any suitable network that can facilitate the exchange of information and/or data for the MRI system 100. In some embodiments, one or more components in the MRI system 100 (e.g., the MRI scanner 110, the terminal 130, the processing device 140, or the storage device 150) may communicate information and/or data with one or more other components of the MRI system 100 via the network 120. For example, the processing device 140 may obtain MR signals from the MRI scanner 110 via the network 120. As another example, the processing device 140 may obtain user instructions from the terminal 130 via the network 120. In some embodiments, the network 120 may be any type of wired or wireless network, or a combination thereof. The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the MRI system 100 may be connected to the network 120 to exchange data and/or information.

The terminal 130 include a mobile device 130-1, a tablet computer 130-2, a laptop computer 130-3, or the like, or any combination thereof. In some embodiments, the mobile device 130-1 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smartwatch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include Google Glasses, an Oculus Rift, a Hololens, a Gear VR, etc. In some embodiments, the terminal 130 may remotely operate the MRI scanner 110. In some embodiments, the terminal 130 may operate the MRI scanner 110 via a wireless connection. In some embodiments, the terminal 130 may receive information and/or instructions inputted by a user, and send the received information and/or instructions to the MRI scanner 110 or to the processing device 140 via the network 120. In some embodiments, the terminal 130 may receive data and/or information from the processing device 140. In some embodiments, the terminal 130 may be part of the processing device 140. In some embodiments, the terminal 130 may be omitted.

The processing device 140 may process data and/or information obtained from the MRI scanner 110, the terminal 130, and/or the storage device 150. For example, the processing device 140 may obtain an initial phase image, for example, from the MRI scanner 110. In some embodiments, the processing device 140 may further process the initial phase image to determine an unwrapped phase image. In some embodiments, the processing device 140 may determine a distribution of a magnetic field (e.g., the main magnetic field) in the detection region of the MRI scanner 110 based on the unwrapped phase image. In some embodiments, the processing device 140 may be a single server, or a server group. The server group may be centralized, or distributed. In some embodiments, the processing device 140 may be local or remote. For example, the processing device 140 may access information and/or data stored in the MRI scanner 110, the terminal 130, and/or the storage device 150 via the network 120. As another example, the processing device 140 may be directly connected to the MRI scanner 110, the terminal 130, and/or the storage device 150 to access stored information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented on a computing device 200 having one or more components illustrated in FIG. 2 in the present disclosure.

The storage device 150 may store data and/or instructions. In some embodiments, the storage device 150 may store data or information obtained from the MRI scanner 110. For example, the processing device 140 may generate a phase image based on MR signals obtained from the MRI scanner 110, and then the generated phase image may be stored in the storage device 150 for further use or processing. In some embodiments, the storage device 150 may store data obtained from the terminal 130 and/or the processing device 140. In some embodiments, the storage device 150 may store data and/or instructions that the processing device 140 may execute or use to perform exemplary methods described in the present disclosure. In some embodiments, the storage device 150 may include a mass storage device, removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components in the MRI system 100 (e.g., the processing device 140, the terminal 130, etc.). One or more components in the MRI system 100 may access the data or instructions stored in the storage device 150 via the network 120. In some embodiments, the storage device 150 may be directly connected to or communicate with one or more components in the MRI system 100 (e.g., the processing device 140, the terminal 130, etc.). In some embodiments, the storage device 150 may be part of the processing device 140.

FIG. 2 is a schematic diagram illustrating exemplary hardware and/or software components of an exemplary computing device 200 on which the processing device 140 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (program code) and perform functions of the processing device 140 in accordance with techniques described herein. The computer instructions may include, for example, routines, programs, objects, components, signals, data structures, procedures, modules, and functions, which perform particular functions described herein. For example, the processor 210 may process data and/or image obtained from the MRI scanner 110, the terminal 130, the storage device 150, and/or any other component in the MRI system 100. Specifically, the processor 210 may process an initial phase image (e.g., an initial phase image obtained from the MRI scanner 110) to generate an unwrapped phase image. In some embodiments, the processor 210 may determine a distribution of a magnet field in the detection region of the MRI scanner 110 based on the unwrapped phase image. In some embodiments, the processor 210 may perform instructions to control the MRI scanner 110. For example, the processor 210 may generate a uniform magnetic field by adjusting, based on the distribution of the magnet field in the detection region, one or more scanning parameters of the MRI scanner 110. In some embodiments, the processor 210 may perform instructions obtained from the terminal 130. In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors, thus operations and/or method steps that are performed by one processor as described in the present disclosure may also be jointly or separately performed by the multiple processors. For example, if in the present disclosure the processor of the computing device 200 executes both process A and process B, it should be understood that process A and process B may also be performed by two or more different processors jointly or separately in the computing device 200 (e.g., a first processor executes process A and a second processor executes process B, or the first and second processors jointly execute processes A and B).

The storage 220 may store data/information obtained from the MRI scanner 110, the terminal 130, the storage device 150, or any other component of the MRI system 100. In some embodiments, the storage 220 may include a mass storage device, removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure. For example, the storage 220 may store a program (e.g., in the form of computer-executable instruction) for the processing device 140 for processing an initial phase image to generate an unwrapped phase image. As another example, the storage 220 may store a program (e.g., in the form of computer-executable instruction) for determining a distribution of a magnet field in the detection region of the MRI scanner 110 based on the unwrapped phase image. As a further example, the storage 220 may store a program (e.g., in the form of computer-executable instruction) for generating a uniform magnetic field by adjusting one or more scanning parameters of the MRI scanner 110 based on the distribution of the magnet field.

The I/O 230 may input or output signals, data, and/or information. In some embodiments, the I/O 230 may enable a user interaction with the processing device 140. In some embodiments, the I/O 230 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 240 may be connected to a network (e.g., the network 120) to facilitate data communications. The communication port 240 may establish connections between the processing device 140 and the MRI scanner 110, the terminal 130, or the storage device 150. The connection may be a wired connection, a wireless connection, or combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 240 may be a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
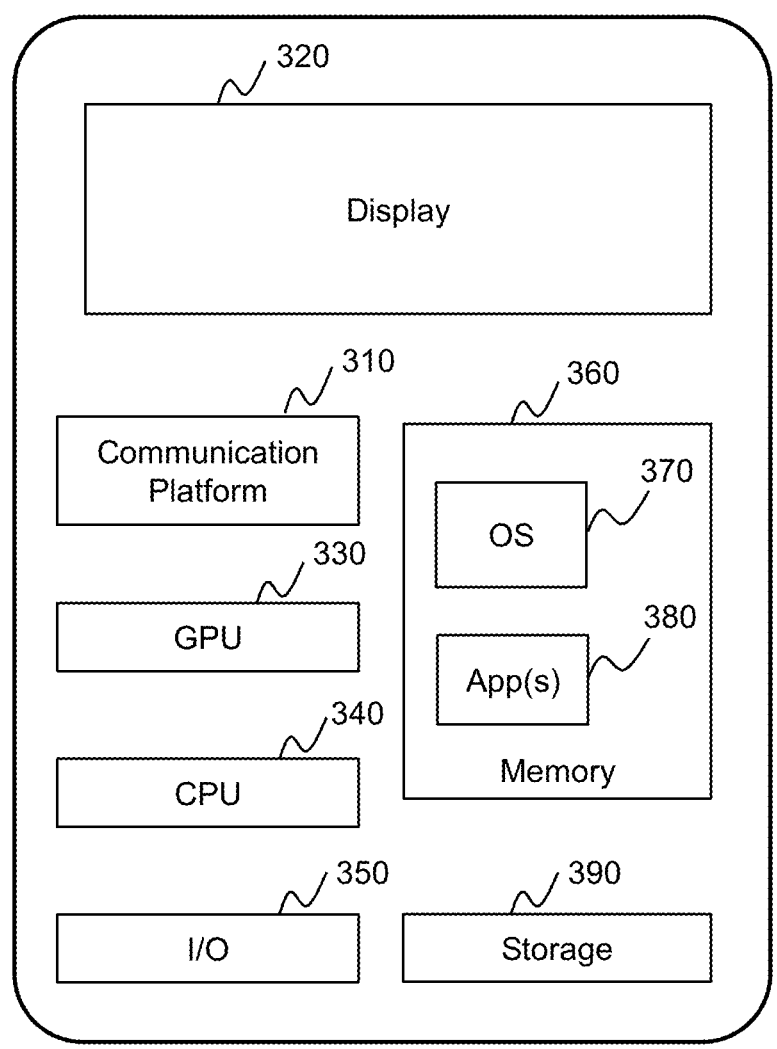
FIG. 3 is a schematic diagram illustrating hardware and/or software components of an exemplary mobile device according to some embodiments of the present disclosure.

FIG. 3 is a schematic diagram illustrating exemplary hardware and/or software components of an exemplary mobile device 300 according to some embodiments of the present disclosure. As illustrated in FIG. 3, the mobile device 300 may include a communication platform 310, a display 320, a graphic processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system 370 (e.g., iOS, Android, Windows Phone, etc.) and one or more applications 380 may be loaded into the memory 360 from the storage 390 in order to be executed by the CPU 340. The applications 380 may include a browser or any other suitable mobile apps for receiving and rendering information relating to image processing or other information from the processing device 140. User interactions with the information stream may be achieved via the I/O 350 and provided to the processing device 140 and/or other components of the MRI system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to determine an unwrapped phase image as described herein. A computer with user interface elements may be used to implement a personal computer (PC) or other type of work station or terminal device, although a computer may also act as a server if appropriately programmed. It is believed that those skilled in the art are familiar with the structure, programming and general operation of such computer equipment and as a result the drawings should be self-explanatory.

Figure 4:
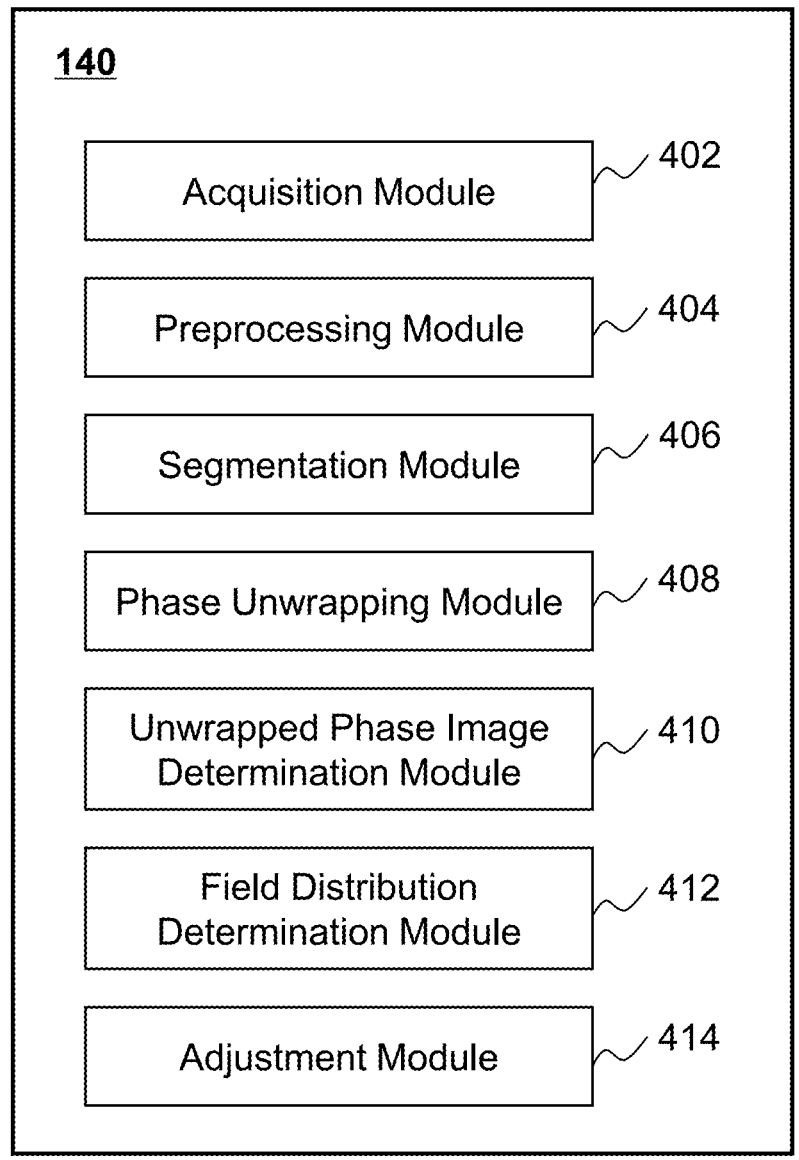
FIG. 4 is a block diagram illustrating an exemplary processing device according to some embodiments of the present disclosure.

FIG. 4 is a block diagram illustrating an exemplary processing device according to some embodiments of the present disclosure. The processing device 140 may be implemented on the computing device 200 (e.g., the processor 210) as illustrated in FIG. 2, or the mobile device 300 (e.g., the CPU 340) as illustrated in FIG. 3. The processing device 140 may include an acquisition module 402, a preprocessing module 404, a segmentation module 406, a phase unwrapping module 408, an unwrapped phase image determination module 410, a field distribution determination module 412, and an adjustment module 414.

The acquisition module 402 may be configured to obtain information related to the MRI system 100. The information may include scan data, image data, or the like. In some embodiments, the acquisition module 402 may obtain an initial phase image. The initial phase image may include a plurality of phase elements. Each phase element of the initial phase image may be a pixel or voxel. In some embodiments, at least one of the plurality of phase elements may be wrapped. In some embodiments, one or more of the plurality of phase elements may be unwrapped. Alternatively or additionally, the acquisition module 402 may obtain an amplitude image. The amplitude image may include a plurality of amplitude elements. Each amplitude element of the amplitude image may correspond to a phase element of the initial phase image. In some embodiments, the initial phase image and/or the amplitude image may be generated according to the same magnetic resonance (MR) signals collected by an MRI scanner (e.g., the MRI scanner 110). Specifically, the initial phase image may be generated by extracting phase information from the MR signals. The amplitude image may be generated by extracting amplitude information from the MR signals.

In some embodiments, the initial phase image may include a two-dimensional (2D) phase image, a three dimensional (3D) phase image, a four-dimensional (4D) phase image, or the like. For example, for a 2D phase image, one dimension may correspond to a phase encoding direction and the other dimension may correspond to a frequency encoding direction. As another example, for a 3D phase image, a first dimension may correspond to a phase encoding direction, a second dimension may correspond to a frequency encoding direction, and a third dimension may correspond to a slice selection direction.

In some embodiments, the acquisition module 402 may obtain the initial phase image and/or the amplitude image from one or more components of the MRI system 100, for example, the MRI scanner 110, a terminal (the terminal 130), a storage device (e.g., the storage device 150), or the like. Alternatively or additionally, the acquisition module 402 may obtain the initial phase image and/or the amplitude image from an external source via the network 120.

The preprocessing module 404 may be configured to preprocess an image (e.g., the initial phase image) to generate a phase mask corresponding to the image (e.g., the initial phase image). In some embodiments, the phase mask may be a binary image. The phase mask may include one or more elements corresponding to residual pixels and/or one or more elements corresponding to non-residual pixels. A residual pixel may correspond to a phase element that is phase wrapped or phase aliased. Merely by way of example, the elements corresponding to residual pixels may have a first value, while the elements corresponding to non-residual pixels may have a second value. To determine the phase mask, the preprocessing module 404 may process the initial phase image based on phase differences between the plurality of phase elements in the initial phase image. According to the phase mask, the residual pixel(s) may be removed from the initial phase image.

Alternatively or additionally, the preprocessing module 404 may remove noise elements (also referred to as noise points) from the initial phase image before generating the phase mask. In some embodiments, the preprocessing module 404 may determine one or more background amplitude elements whose amplitude values are lower than a threshold from the obtained amplitude image. The preprocessing module 404 may update the initial phase image by designating phase values of one or more phase elements (also referred to as noise points) corresponding to the determined background amplitude elements as 0. Then the preprocessing module 404 may generate a phase mask based on the updated initial phase images. According to the phase mask, the residual pixel(s) and the noise point(s) may be removed from the initial phase image. Details regarding the generation of the phase mask may be found elsewhere in the present disclosure (e.g., operation 503 of process 500, process 600, and the descriptions thereof).

The segmentation module 406 may be configured to generate at least two segmental phase images by segmenting the initial phase image along at least two directions (or dimensions) based on the phase mask. As described above, the phase mask may include one or more elements corresponding to the residual pixels. The segmentation module 406 may segment the initial phase image along the at least two directions based on the elements corresponding to the residual pixels in the phase mask. In some embodiments, the at least two directions may include a phase encoding direction, a frequency encoding direction, a slice selection, and/or a direction corresponding to a time dimension, or the like. Merely by way of example, the segmentation module 406 may segment the initial phase image along a phase encoding direction based on the phase mask to generate multiple first 1D data segments. The multiple first 1D data segments may form a segmental phase image with respect to the phase encoding direction. As another example, the segmentation module 406 may segment the initial phase image along a frequency encoding direction based on the phase mask to generate multiple second 1D data segments. The multiple second 1D data segments may form a segmental phase image with respect to the frequency encoding direction. Details regarding the generation of the segmental phase image(s) may be found elsewhere in the present disclosure (e.g., operation 505 of process 500, and the descriptions thereof).

The phase unwrapping module 408 may be configured to generate at least two intermediate phase images by performing phase unwrapping on each of the at least two segmental phase images, respectively. Each intermediate phase image may correspond to one of the at least two segmental phase images, and may include a plurality of unwrapped phase elements. The phase unwrapping of each segmental phase image may be performed along one direction. Merely by way of example, the phase unwrapping module 408 may perform 1D phase unwrapping on 1D data segments (e.g., the first 1D data segments, the second 1D data segments) of each segmental phase images. Details regarding the determination of the intermediate phase image(s) may be found elsewhere in the present disclosure (e.g., operation 507 of process 500, process 700, and the descriptions thereof).

The unwrapped phase image determination module 410 may be configured to determine an unwrapped phase image corresponding to the initial phase image based on the at least two intermediate phase images. In some embodiments, the unwrapped phase image determination module 410 may determine whether the at least two intermediate phase images have a defect relating to the one or more residual pixels described above. The unwrapped phase image determination module 410 may designate one of the at least two intermediate phase images as the unwrapped image in response to a determination that the at least two intermediate phase images do not have the defect relating to the one or more residual pixels. Alternatively, in response to a determination that at least one of the at least two intermediate phase images has a defect relating to at least one of the one or more residual pixels, the unwrapped phase image determination module 410 may modify the intermediate phase image that has the defect to eliminate or reduce the defect, and designate the modified intermediate phase image as the unwrapped phase image. Details regarding the determination of the unwrapped phase image may be found elsewhere in the present disclosure (e.g., process 800 and the descriptions thereof).

The field distribution determination module 412 may be configured to determine a distribution of a magnetic field in a detection region of a MRI scanner (e.g., the MRI scanner 110) based on the unwrapped phase image. The distribution information of the magnetic field may include the uniformity of the magnetic field, the intensity of the magnetic field, or the like, or any combination thereof. In some embodiments, the field distribution determination module 412 may determine the distribution of the magnetic field according to the phase values of the phase elements of the unwrapped phase image.

The adjustment module 414 may be configured to generate a uniform magnetic field by adjusting one or more scanning parameters of the MRI scanner 110 based on the distribution of the magnetic field. In some embodiments, the MRI scanner 110 may cause the superconducting magnet to generate a uniform magnetic field based on the adjusted scanning parameter(s).

The modules in the processing device 140 may be connected to or communicate with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth, a ZigBee, a Near Field Communication (NFC), or the like, or any combination thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

In some embodiments, two or more of the modules may be combined into a single module. For example, the phase unwrapping module 408 and the unwrapped phase image determination module 410 may be integrated into one single module configured to perform the functions thereof. Alternatively, any one of the modules may be divided into two or more units. For example, the phase unwrapping module 408 may be divided into two units. A first unit may be configured to perform phase unwrapping on a first segmental phase image (e.g., a segmental phase image with respect to the X-axis direction), and a second unit may be configured to perform phase unwrapping on a segmental phase image (e.g., a segmental phase image with respect to the Y-axis direction). In some embodiments, the processing device 140 may include one or more additional modules. For example, the processing device 140 may include a storage module (not shown). The storage module may be configured to store data generated during any process performed by any component of the processing device 140.

Figure 5:
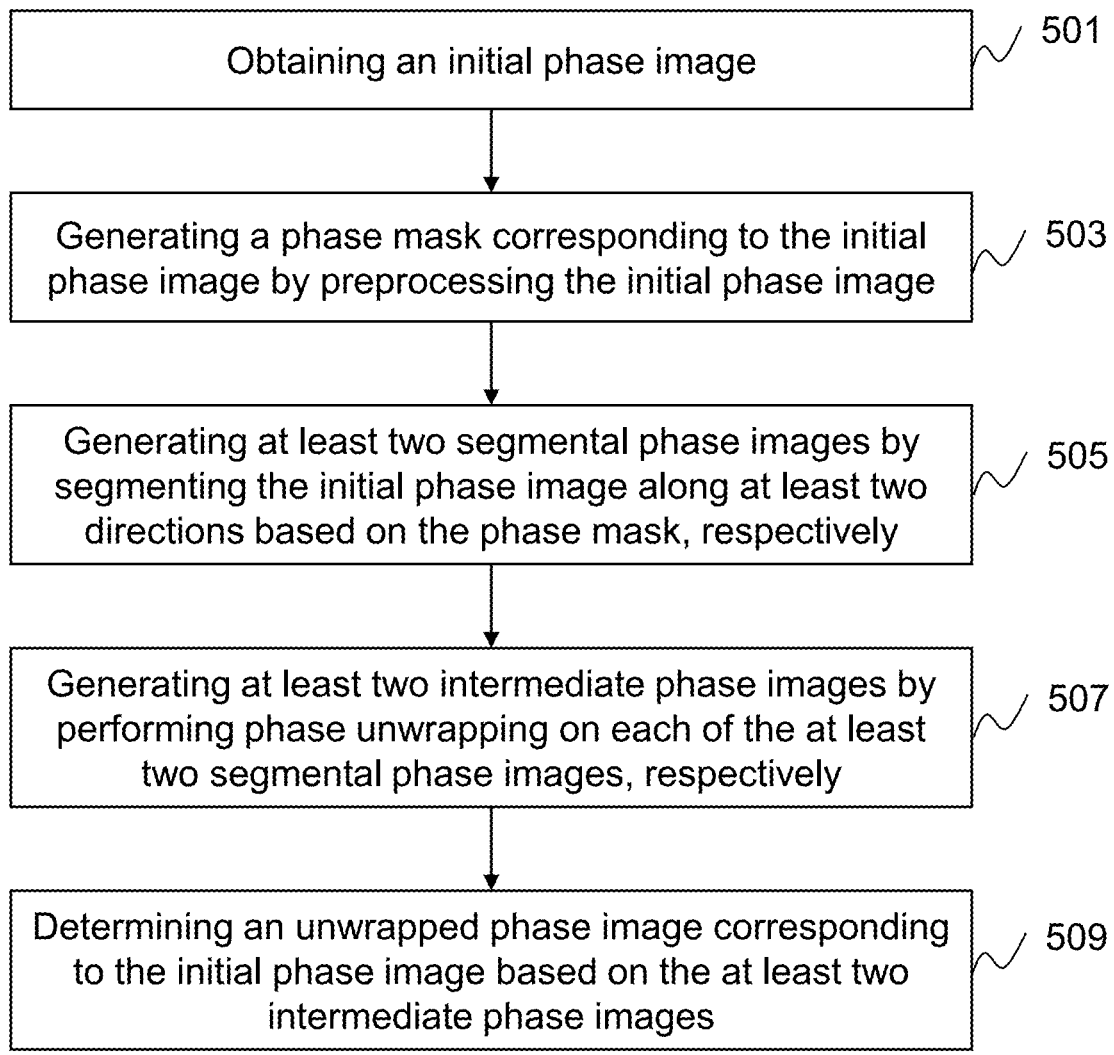
FIG. 5 is a flowchart illustrating an exemplary process for determining an unwrapped phase image according to some embodiments of the present disclosure.

FIG. 5 is a flowchart illustrating an exemplary process for determining an unwrapped phase image according to some embodiments of the present disclosure. In some embodiments, one or more operations of process 500 may be implemented in the MRI system 100 illustrated in FIG. 1. For example, the process 500 may be stored in the storage device 150 and/or the storage 220 in the form of instructions (e.g., an application), and invoked and/or executed by the processing device 140 (e.g., the processor 210 of the computing device 200 as illustrated in FIG. 2, the CPU 340 of the mobile device 300 as illustrated in FIG. 3, one or more modules of the processing device 140 as illustrated in FIG. 4, or the like). As another example, a portion of the process 500 may be implemented on the MRI scanner 110. The operations of the illustrated process presented below are intended to be illustrative. In some embodiments, the process 500 may be accomplished with one or more additional operations not described, and/or without one or more of the operations discussed. Additionally, the order in which the operations of the process 500 as illustrated in FIG. 5 and described below is not intended to be limiting.

In 501, the processing device 140 (e.g., the acquisition module 402) may obtain an initial phase image. The initial phase image may include a plurality of phase elements. Each phase element of the initial phase image may be a pixel or voxel, and each phase element may have a phase value. In some embodiments, at least one of the plurality of phase elements may be wrapped.

In some embodiments, the initial phase image may include a two-dimensional (2D) phase image, a three-dimensional (3D) phase image, a four-dimensional (4D) phase image, etc. Merely by way of example, for a 2D phase image, one dimension may correspond to a phase encoding direction and the other dimension may correspond to a frequency encoding direction. For a 3D phase image, a first dimension may correspond to a phase encoding direction, a second dimension may correspond to a frequency encoding direction, and a third dimension may correspond to a slice selection direction. In some embodiments, the initial phase image may further include a time dimension.

Figure 11:
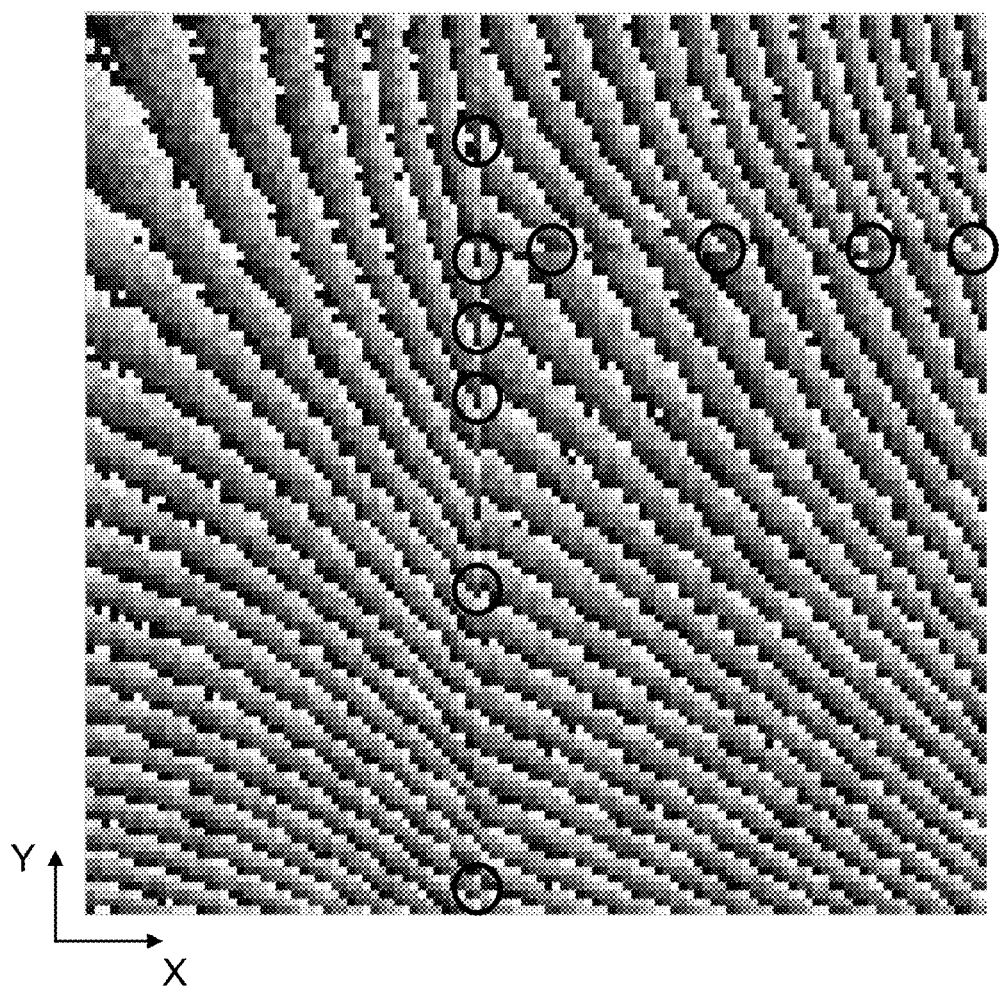
FIG. 11 shows an exemplary initial phase image according to some embodiments of the present disclosure.

In some embodiments, the initial phase image may be generated according to magnetic resonance (MR) signals collected by an MRI scanner (e.g., the MRI scanner 110). Merely by way of example, the MRI scanner 110 may perform a scan (or a pre-scan) on a subject located within the detection region. During the scan, RF pulses that are generated by the RF (transmit) coils may be transmitted to the subject. Under the coordinated action of the main magnetic field, the gradient magnetic field, and the RF pulses, MR signals relating to the subject may be generated. The generated MR signals may be collected by the RF (receiver) coils. Then the initial phase image may be generated by extracting phase information from the MR signals. In some embodiments, the phase information may be extracted from the MR signals based on an inverse trigonometric function. Thus, the phase information may be limited within a range of $2\pi$, for example, $(-\pi, \pi]$, $(0, 2\pi]$, etc. If an actual phase exceeds this range, the actual phase may be wrapped into the range, and lead to an error of $2n\pi$ (n may be a signed nonzero integer). A phase image (e.g., the initial phase image) generated according to the wrapped phase information may have a wrapping artifact (e.g., phase mutation marked with solid circles as illustrated in FIG. 11). In general, a phase image can reflect multiple physical information, for example, a distribution of the magnetic field, the current state of the MRI system 100, or the like, or any combination thereof. Thus, it may be desirable to eliminate or reduce the wrapping artifact by performing a phase unwrapping on the wrapped phase image (e.g., the initial phase image).

In some embodiments, the acquisition module 402 may obtain the initial phase image from one or more components of the MRI system 100, for example, the MRI scanner 110, a terminal (the terminal 130), a storage device (e.g., the storage device 150), or the like. Alternatively or additionally, the acquisition module 402 may obtain the initial phase image from an external source via the network 120.

In 503, the processing device 140 (e.g., the preprocessing module 404) may generate a phase mask by preprocessing the initial phase image. The phase mask may correspond to the initial phase image. In some embodiments, the phase mask may be a binary image. The phase mask may include one or more elements corresponding to residual pixels and/or one or more elements corresponding to non-residual pixels. Merely by way of example, the elements corresponding to residual pixels may have a first value, while the elements corresponding to non-residual pixels may have a second value. The first value and the second value may be different. For example, the first value may be 1, while the second value may be 0. As another example, the first value may be 0, while the second value may be 1. The values are merely provided for the purposes of illustration, and not intended to limit the scope of the present disclosure. In some embodiments, the phase mask may include one or more elements (e.g., elements corresponding to residual pixels) whose values are 0. In some embodiments, the preprocessing module 404 may generate the phase mask by processing the initial phase image based on phase differences between the plurality of phase elements in the initial phase image.

In some embodiments, the preprocessing module 404 may determine a plurality of residual values for the plurality of phase elements in the initial phase image. The preprocessing module 404 may determine one or more residual pixels based on the plurality of residual values. A residual pixel may be a point that a closed path integral around the point is not zero. In some embodiments, the preprocessing module 404 may designate one or more phase elements whose residual values satisfy a condition (e.g., the residual value being nonzero (e.g., +1 or −1)) as residual pixels. The preprocessing module 404 may generate the phase mask corresponding to the initial phase image based on the one or more residual pixels. According to the phase mask, the residual pixel(s) may be removed from the initial phase image.

Alternatively or additionally, the preprocessing module 404 may remove noise elements (also referred to as noise points), for example, before determining residual values for the phase elements in the initial image, from the initial phase image. Merely by way of example, the preprocessing module 404 may obtain an amplitude image corresponding to the initial phase image. The amplitude image and the initial phase image may be generated based on the same MRI signals. The amplitude image may include a plurality of amplitude elements. Each amplitude element of the amplitude image may correspond to a phase element of the initial phase image. In some embodiments, the preprocessing module 404 may determine one or more background amplitude elements from the amplitude image. The amplitude value of each background amplitude element may be lower than a threshold. In some embodiments, the preprocessing module 404 may update the initial phase image by designating phase values of one or more phase elements (also referred to as noise points) corresponding to the determined background amplitude elements as 0. In some embodiments, the preprocessing module 404 may generate a phase mask based on the updated initial phase image as illustrated above. Then the residual pixel(s) and the noise point(s) may be removed from the initial phase image. Details regarding the generation of the phase mask may be found elsewhere in the present disclosure (e.g., FIG. 6 and the descriptions thereof).

In some embodiments, the residual pixel(s) may be introduced into the initial phase image in the generation of the initial phase image due to noise or large local phase gradients. In some embodiments, the noises point(s) may belong to a background area of the initial phase image. The residual pixel(s) and/or the noise point(s) may be identified or removed from the initial phase image and do not participate in phase unwrapping, which may enhance the stability and reliability of the phase unwrapping.

In 505, the processing device 140 (e.g., the segmentation module 406) may generate at least two segmental phase images by segmenting the initial phase image along at least two directions (or dimensions) based on the phase mask, respectively. In some embodiments, the processing device 140 may generate two segmental phase images by segmenting, along a first direction and a second direction, the initial phase image into a plurality of line-segments, respectively. The at least two segmental phase images may be related to the at least two directions. In some embodiments, the at least two directions may include a phase encoding direction, a frequency encoding direction, a slice selection direction, and/or a direction corresponding to a time dimension, or the like. For example, the at least two directions may include a phase encoding direction and a frequency encoding direction. As described above, the phase mask may include one or more elements corresponding to the residual pixels. The segmentation module 406 may segment the initial phase image along the at least two directions based on the phase mask (e.g., the elements corresponding to the residual pixel (s) in the phase mask).

Merely by way of example, the initial phase image may be a 2D phase image Q. A first dimension (or direction) of the at least two directions may correspond to a phase encoding direction (also referred to as an X-axis direction). A second dimension (or direction) of the at least two directions may correspond to a frequency encoding direction (also referred to as a Y-axis direction). The 2D phase image Q may be expressed as a matrix A:

$$A = \begin{bmatrix} a_{11} & a_{12} & a_{13} & a_{14} \\ a_{21} & a_{22} & a_{23} & a_{24} \\ a_{31} & a_{32} & a_{33} & a_{34} \\ a_{41} & a_{42} & a_{43} & a_{44} \end{bmatrix}, \quad (1)$$

wherein the row direction of the matrix A corresponds to the X-axis direction of a coordinate system (or the phase encoding direction); the column direction of the matrix A corresponds to the Y-axis direction of the coordinate system (or the frequency encoding direction); $a_{11}$ corresponds to the origin of the coordinate system; and the data in the matrix A represent phase values of phase elements of the 2D phase image Q. For example, $a_{11}$ may represent the phase value of phase element $(x_1, y_1)$ of the 2D phase image Q.

Merely by way of example, the 2D phase image Q may include two residual pixels, for example, residual pixel $(x_2, y_2)$ and residual pixel $(x_3, y_2)$. The phase value of the residual pixel $(x_2, y_2)$ may be $a_{22}$. The phase value of the residual pixel $(x_3, y_2)$ may be $a_{23}$. Correspondingly, an exemplary phase mask may be expressed as a matrix B, for example, $$\begin{bmatrix} 1 & 1 & 1 & 1 \\ 1 & 0 & 0 & 1 \\ 1 & 1 & 1 & 1 \\ 1 & 1 & 1 & 1 \end{bmatrix}.$$

The segmentation module 406 may segment the 2D phase image Q along the X-axis direction based on the phase mask (i.e., elements corresponding to the residual pixels $(x_2, y_2)$ and $(x_3, y_2)$) to generate five 1D data segments (also referred to as line-segments). The five 1D data segments may include $[a_{11}, a_{12}, a_{13}, a_{14}]$, $[a_{21}]$, $[a_{24}]$, $[a_{31}, a_{32}, a_{33}, a_{34}]$, and $[a_{41}, a_{42}, a_{43}, a_{44}]$. The five 1D data segments may form a segmental phase image with respect to the X-axis direction (also referred to as a first segmental phase image).

The segmentation module 406 may segment the 2D phase image Q along the Y-axis direction based on the phase mask (i.e., elements corresponding to the residual pixels $(x_2, y_2)$ and $(x_3, y_2)$) to generate six 1D data segments (also referred to as line-segments). The six 1D data segments may include $$\begin{bmatrix} a_{11} \\ a_{21} \\ a_{31} \\ a_{41} \end{bmatrix}, \; [a_{12}], \; \begin{bmatrix} a_{32} \\ a_{42} \end{bmatrix},$$

$$[a_{13}], \; \begin{bmatrix} a_{33} \\ a_{43} \end{bmatrix}, \; \begin{bmatrix} a_{14} \\ a_{24} \\ a_{34} \\ a_{44} \end{bmatrix}.$$

The six 1D data segments may form a segmental phase image with respect to the Y-axis direction (also referred to as a second segmental phase image).

In 507, the processing device 140 (e.g., the phase unwrapping module 408) may generate at least two intermediate phase images by performing phase unwrapping on each of the at least two segmental phase images, respectively. Each intermediate phase image may correspond to one of the at least two segmental phase images, and may include a plurality of unwrapped phase elements. The phase unwrapping of each segmental phase image may be performed along one direction. For example, the phase unwrapping module 408 may perform phase unwrapping on the first segmental phase image along the X-axis direction, and perform phase unwrapping on the second segmental phase image along the Y-axis direction. In some embodiments, the phase unwrapping module 408 may perform phase unwrapping on a segmental phase image along a phase encoding direction, a frequency encoding direction, a slice selection direction, or a direction corresponding to a time dimension, or the like.

In some embodiments, the phase unwrapping module 408 may first generate at least two initial unwrapped images corresponding to the at least two segmental phase images by performing phase unwrapping on the at least two segmental phase images, respectively. For example, the phase unwrapping module 408 may perform 1D phase unwrapping on 1D data segments of each segmental phase image. In some embodiments, the phase unwrapping module 408 may determine a set of optimized coefficients for each initial unwrapped image based on a condition associated with a difference between the at least two initial unwrapped images. In some embodiments, to determine the set of optimized coefficients for each initial unwrapped image, the phase unwrapping module 408 may set a set of initial coefficients for each initial unwrapped image, and optimize the set of initial coefficients by performing an iterative optimization to determine the set of optimized coefficients. The phase unwrapping module 408 may determine the at least two intermediate phase images based on the set of optimized coefficients and the at least two initial unwrapped images. Details regarding the determination of the intermediate phase image(s) may be found elsewhere in the present disclosure (e.g., FIG. 7 and the descriptions thereof).

In 509, the processing device 140 (e.g., the unwrapped phase image determination module 410) may determine an unwrapped phase image corresponding to the initial phase image based on the at least two intermediate phase images.

In some embodiments, the unwrapped phase image determination module 410 may determine whether the at least two intermediate phase images have a defect relating to the one or more residual pixels described in operation 503. In some embodiments, the unwrapped phase image determination module 410 may determine that at least two intermediate phase images do not have a defect relating to the one or more residual pixels. In response to a determination that the at least two intermediate phase images do not have a defect relating to the one or more residual pixels, the unwrapped phase image determination module 410 may designate one of the at least two intermediate phase images as the unwrapped phase image. Alternatively, in some embodiments, the unwrapped phase image determination module 410 may determine that at least one of the at least two intermediate phase images has a defect relating to the one or more residual pixels. In response to a determination that at least one of the at least two intermediate phase images has a defect relating to at least one of the one or more residual pixels, the unwrapped phase image determination module 410 may modify the intermediate phase image that has the defect to eliminate or reduce the defect. The unwrapped phase image determination module 410 may then designate the modified intermediate phase image as the unwrapped phase image. Details regarding the determination of the unwrapped phase image may be found elsewhere in the present disclosure (e.g., FIG. 8 and the descriptions thereof).

It should be noted that the above description of the process 500 is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. In some embodiments, the initial phase image may be a 3D phase image. The first dimension may correspond to the phase encoding direction, the second dimension may correspond to the frequency encoding direction, and the third dimension may correspond to the slice selection direction. Therefore, in 505, the segmentation module 406 may segment the initial phase image along the phase encoding direction, the frequency encoding direction, and the slice selection direction to generate a plurality of segmental phase images. In some embodiments, the initial phase image obtained in 501, or the unwrapped phase image determined in 509 may be further used to determine a distribution of a magnetic field in a detection region of an MRI scanner (e.g., the MRI scanner 110). The distribution information determined may include the magnetic uniformity, the magnetic field intensity, or the like, in the detection region. In some embodiments, the distribution information may be further used to determine one or more desired scanning parameters of the MRI scanner 110, and then a uniform distribution of the magnetic field in the detection region of the MRI scanner 110 may be achieved by adjusting one or more current scanning parameters of the MRI scanner 110 and/or the desired scanning parameters of the MRI scanner 110.

Figure 6:
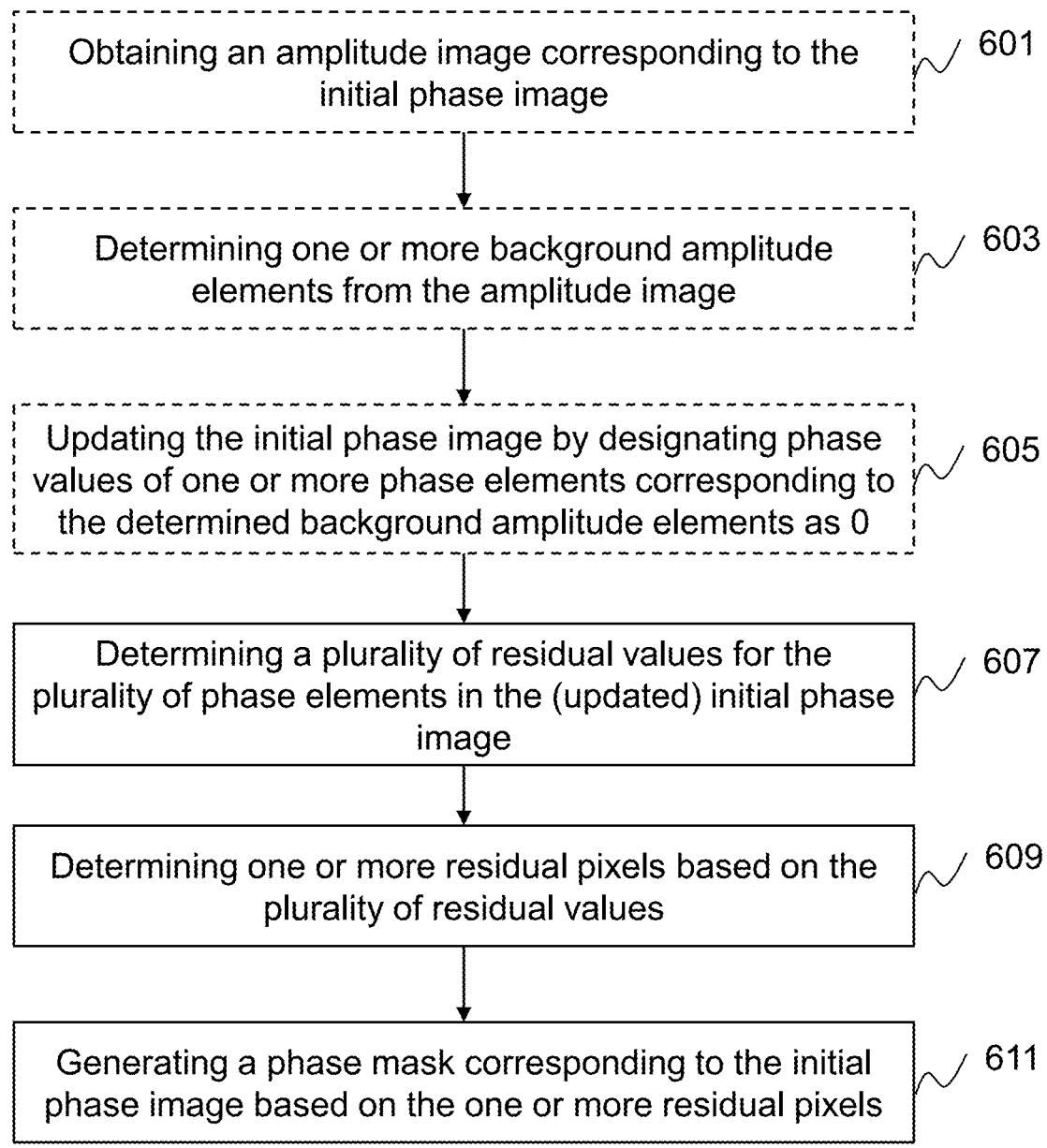
FIG. 6 is a flowchart illustrating an exemplary process for determining a phase mask according to some embodiments of the present disclosure.

FIG. 6 is a flowchart illustrating an exemplary process for determining a phase mask according to some embodiments of the present disclosure. In some embodiments, one or more operations of process 600 may be implemented in the MRI system 100 illustrated in FIG. 1. For example, the process 600 may be stored in the storage device 150 and/or the storage 220 in the form of instructions (e.g., an application), and invoked and/or executed by the processing device 140 (e.g., the processor 210 of the computing device 200 as illustrated in FIG. 2, the CPU 340 of the mobile device 300 as illustrated in FIG. 3, one or more modules of the processing device 140 as illustrated in FIG. 4, or the like). As another example, a portion of the process 600 may be implemented on the MRI scanner 110. The operations of the illustrated process presented below are intended to be illustrative. In some embodiments, the process 600 may be accomplished with one or more additional operations not described, and/or without one or more of the operations discussed. Additionally, the order in which the operations of the process 600 as illustrated in FIG. 6 and described below is not intended to be limiting. In some embodiments, operation 503 illustrated in FIG. 5 may be performed according to the process 600.

In 601, the processing device 140 (e.g., the acquisition module 402) may obtain an amplitude image corresponding to the initial phase image. The amplitude image may include a plurality of amplitude elements. Each amplitude element of the amplitude image may correspond to a pixel or voxel. Each amplitude element may have an amplitude value. Each amplitude element of the amplitude image may correspond to a phase element of the initial phase image. The amplitude image may be generated according to MR signals collected by an MRI scanner (e.g., the MRI scanner 110). For example, the amplitude image may be generated by extracting amplitude information from the MR signals. The amplitude image and the initial phase image may be generated based on the same MR signals.

In some embodiments, the acquisition module 402 may obtain the amplitude image from one or more components of the MRI system 100, for example, the MRI scanner 110, a terminal (e.g., the terminal 130), a storage device (e.g., the storage device 150). Alternatively or additionally, the acquisition module 402 may obtain the amplitude image from an external source via the network 120.

In 603, the processing device 140 (e.g., the preprocessing module 404) may determine one or more background amplitude elements from the amplitude image. The amplitude value of each background amplitude element may be lower than a threshold. The threshold may be a default setting of the MRI system 100, or preset by a user or operator via the terminal 130. In some embodiments, the preprocessing module 404 may compare the amplitude value of an amplitude element with the threshold. In response to a determination that the amplitude value of the amplitude element is lower than the threshold, the preprocessing module 404 may designate the amplitude element as a background amplitude element.

The background amplitude elements may belong to a background area of the amplitude image. In some embodiments, an amplitude mask may be generated based on the one or more background amplitude elements. The amplitude mask may include one or more elements corresponding to the background amplitude elements. In the amplitude mask, the elements corresponding to the background amplitude elements may have values of 0.

In 605, the processing device 140 (e.g., the preprocessing module 404) may update the initial phase image by designating phase values of one or more phase elements corresponding to the determined background amplitude elements as 0. The one or more phase elements corresponding to the determined background amplitude elements may belong to a background area of the initial phase image, and may also be referred to as noise points. To improve the stability and reliability of phase unwrapping, the one or more phase elements corresponding to the determined background amplitude elements (e.g., the noise points) do not participate in the phase unwrapping. Thus, the preprocessing module 404 may designate the phase values of the one or more phase elements corresponding to the determined background amplitude elements (e.g., the noise points) as 0.

Figure 10:
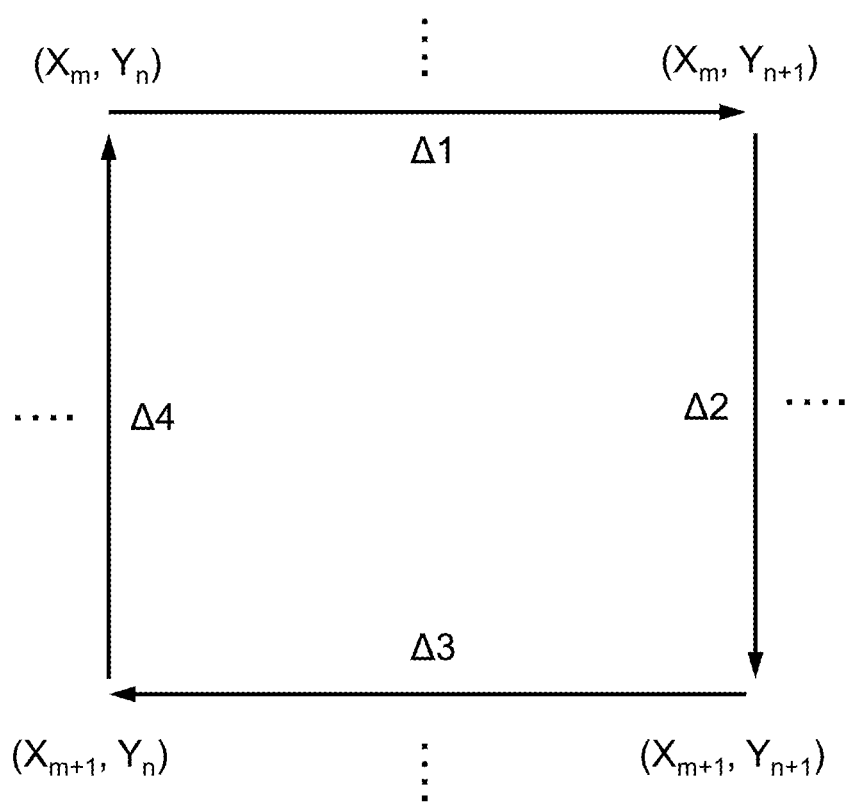
FIG. 10 shows four exemplary phase elements of an (updated) initial phase image according to some embodiments of the present disclosure.

In 607, the processing device 140 (e.g., the preprocessing module 404) may determine a plurality of residual values for the plurality of phase elements in the (updated) initial phase image. Each residual value may correspond to a phase element and may be related to one or more phase differences between the phase element and one or more phase elements next to (or adjacent to) the phase element. In some embodiments, the one or more phase elements next to the phase element may include one or more 4-connected neighborhood elements, and/or one or more D-neighborhood elements. In some embodiments, the one or more phase elements next to the phase element may further include one or more 8-neighborhood elements. For example, as illustrated in FIG. 10, phase elements $(X_m, Y_{n+1})$, $(X_{m+1}, Y_n)$ and $(X_{m+1}, Y_{n+1})$ may be next to the phase element $(X_m, Y_n)$. Specifically, the phase elements $(X_m, Y_{n+1})$ and $(X_{m+1}, Y_n)$ are 4-connected neighborhood elements of the phase element $(X_m, Y_n)$, and the phase element $(X_{m+1}, Y_{n+1})$ is a D-neighborhood element of the phase element $(X_m, Y_n)$. For each phase element, the preprocessing module 404 may perform a closed-loop phase unwrapping on the each phase element and one or more phase elements next to the each phase element to determine a residual value of the phase element.

In some embodiments, if a phase element locates at an edge of the initial phase image (e.g., being at the rightmost side or the bottom side), the preprocessing module 404 may supplement one or more phase elements next to the phase element and designate the phase values of the supplemented phase element(s) as a predetermined value (e.g., 0). For example, if a phase element is located at the rightmost side, the preprocessing module 404 may supplement a 4-connected neighborhood element and a D-neighborhood element on the right and designate the phase values of the supplemented element(s) as 0. As another example, if a phase element is located at the bottom, the preprocessing module 404 may supplement a 4-connected neighborhood element and a D-neighborhood element at the bottom and designate the phase values of the supplemented element(s) as 0.

Merely by way of example, FIG. 10 shows four exemplary phase elements of an (updated) initial phase image according to some embodiments of the present disclosure. As shown in FIG. 10, the four phase elements are represented as $(X_m, Y_n)$, $(X_m, Y_{n+1})$, $(X_{m+1}, Y_n)$, and $(X_{m+}, Y_{n+1})$. The phase elements $(X_m, Y_{n+1})$, $(X_{m+1}, Y_n)$, and $(X_{m+1}, Y_{n+1})$ may be phase elements next to the phase element $(X_m, Y_n)$. The phase values of the four phase elements may be represented as Ø(m, n), Ø(m, n+1), Ø(m+1, n), and Ø(m+1, n+1), respectively.

As shown in FIG. 10, a first phase difference Δ1 may be determined based on the phase values of the phase element $(X_m, Y_n)$ and the phase element $(X_m, Y_{n+1})$. Specifically, the first phase difference Δ1 may be determined according to Equation (2):

$$\Delta 1 = Ø(m, n+1) - Ø(m, n). \quad (2)$$

If the first phase difference Δ1>π, Δ1 may be subtracted by 2π, and then an updated first phase difference Δ1' may be determined. Accordingly, the phase value Ø(m, n+1) of the phase element $(X_m, Y_{n+1})$ may be updated according to Equation (2'):

$$Ø'(m, n+1) = \Delta 1' + Ø(m, n), \quad (2')$$

wherein Ø'(m, n+1) represents the updated phase value of Ø(m, n+1).

As shown in FIG. 10, a second phase difference Δ2 may be determined based on the phase values of the phase element $(X_m, Y_{n+1})$ and the phase element $(X_{m+1}, Y_{n+1})$. Specifically, the second phase difference Δ2 may be determined according to Equation (3):

$$\Delta 2 = Ø(m+1, n+1) - Ø(m, n+1). \quad (3)$$

If the second phase difference Δ2>π, Δ2 may be subtracted by 2π, and then an updated second phase difference Δ2' may be determined. Accordingly, the phase value Ø(m+1, n+1) of the phase element $(X_{m+1}, Y_{n+1})$ may be updated according to Equation (3'):

$$Ø'(m+1, n+1) = \Delta 2' + Ø(m, n+1), \quad (3')$$

wherein Ø'(m+1, n+1) represents the updated phase value of Ø(m+1, n+1).

As shown in FIG. 10, a third phase difference Δ3 may be determined based on the phase values of the phase element $(X_{m+1}, Y_{n+1})$ and the phase element $(X_{m+1}, Y_n)$. Specifically, the third phase difference Δ3 may be determined according to Equation (4):

$$\Delta 3 = Ø(m+1, n) - Ø(m+1, n+1). \quad (4)$$

If the third phase difference Δ3>π, Δ3 may be subtracted by 2π, and then an updated third phase difference Δ3' may be determined. Accordingly, the phase value Ø(m+1, n) of the phase element $(X_{+1}, Y_n)$ may be updated according to Equation (4'):

$$Ø(m+1, n) = \Delta 3' + Ø(m+1, n+1), \quad (4')$$

wherein Ø'(m+1, n) represents the updated phase value of Ø(m+1, n).

As shown in FIG. 10, a fourth phase difference Δ4 may be determined based on the phase values of the phase element $(X_{m+1}, Y_n)$ and the phase element $(X_m, Y_n)$. Specifically, the fourth phase difference Δ4 may be determined according to Equation (5):

$$\Delta 4 = Ø(m, n) - Ø(m+1, n). \quad (5)$$

A sum of the phase differences Δ1, Δ2, Δ3, and Δ4 may be determined according to Equation (6):

$$\Delta = \Delta 1 + \Delta 2 + \Delta 3 + \Delta 4. \quad (6)$$

In some embodiments, if the sum of phase differences z>0, the residual value of the phase element $(X_m, Y_n)$ may be designated as +1. In some embodiments, if the sum of phase differences Δ<0, the residual value of the phase element $(X_m, Y_n)$ may be designated as −1. If the sum of phase differences Δ is equal to 0, the residual value of the phase element $(X_m, Y_n)$ may be designated as 0.

In 609, the processing device 140 (e.g., the preprocessing module 404) may determine one or more residual pixels based on the plurality of residual values. In some embodiments, the preprocessing module 404 may designate one or more phase elements whose residual values satisfy a predetermined condition as residual pixels. The predetermined condition may refer to a residual value of a phase element being nonzero (e.g., +1 or −1). For example, if a residual value of a phase element (e.g., the phase element $(X_m, Y_n)$) is +1 or −1, the preprocessing module 404 may determine the phase element as a residual pixel.

In some embodiments, the preprocessing module 404 may also designate one or more candidate phase elements next to a determined residual pixel as residual pixels. The residual value of the determined residual pixel may be determined based on the one or more candidate phase elements. A candidate phase element may be a phase element that is involved in a determination of the residual value of the determined residual pixel. For example, if the phase element $(X_m, Y_n)$ is determined as a residual pixel, the preprocessing module 404 may further determine the phase elements $(X_m, Y_{n+1})$, $(X_{m+1}, Y_n)$ and $(X_{m+1}, Y_{n+1})$ as residual pixels. By this operation, the number (or count) of the phase elements that need to be unwrapped may be decreased, which may accelerate phase unwrapping of the (initial) phase image.

In 611, the processing device 140 (e.g., the preprocessing module 404) may generate a phase mask corresponding to the initial phase image based on the one or more residual pixels. The phase mask may include elements corresponding to the one or more residual pixels. In some embodiments, the phase mask may include elements corresponding to the residual pixels whose residual values are nonzero (e.g., +1 or −1). Alternatively or additionally, the phase mask may include elements corresponding to the residual pixels whose residual values are nonzero (e.g., +1 or −1), and elements corresponding to candidate phase elements next to the residual pixels.

The phase mask may include one or more elements corresponding to one or more residual pixels of the initial phase image and/or one or more elements corresponding to one or more non-residual pixels of the initial phase image. In some embodiments, the elements corresponding to residual pixels of the initial phase image may have different values with the elements corresponding to non-residual pixels of the initial phase image. For example, the preprocessing module 404 may set the element(s) of the phase mask corresponding to residual pixel(s) as 0 and the others as a nonzero value (e.g., 1). Alternatively, the element(s) of the phase mask corresponding to residual pixel(s) may not be displayed, while the other elements may be displayed. That is, the residual pixel(s) may be removed from the (initial) phase image according to the phase mask, for example, in further processing.

In some embodiments, the residual pixels may be introduced into the initial phase image due to noise, large local phase gradients, or the like. In some embodiments, the residual pixels may be removed from the (updated) initial phase image, and may not participate in phase unwrapping, which may enhance the stability and reliability of the phase unwrapping.

It should be noted that the above description of the process 600 is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. For example, operations 601 through 605 may be omitted. The preprocessing module 404 may determine a plurality of residual values for the plurality of phase elements in the initial phase image. As another example, operations 601 through 605 may be performed after operation 611. After operation 611, the residual pixel(s) may have been removed from the initial phase image. The preprocessing module 404 may then perform operations 601 through 605 to remove noise point(s) (e.g., phase element(s) corresponding to background amplitude element(s) of the amplitude image) from the processed initial phase image. Thus, the residual pixel(s) and the noise point(s) may both be removed from the initial phase image.

FIG. 7 is a flowchart illustrating an exemplary process for determining at least two intermediate phase images according to some embodiments of the present disclosure. In some embodiments, one or more operations of process 700 may be implemented in the MRI system 100 illustrated in FIG. 1.

For example, the process 700 may be stored in the storage device 150 and/or the storage 220 in the form of instructions (e.g., an application), and invoked and/or executed by the processing device 140 (e.g., the processor 210 of the computing device 200 as illustrated in FIG. 2, the CPU 340 of the mobile device 300 as illustrated in FIG. 3, one or more modules of the processing device 140 as illustrated in FIG. 4, or the like). As another example, a portion of the process 700 may be implemented on the MRI scanner 110. The operations of the illustrated process presented below are intended to be illustrative. In some embodiments, the process 700 may be accomplished with one or more additional operations not described, and/or without one or more of the operations discussed. Additionally, the order in which the operations of the process 700 as illustrated in FIG. 7 and described below is not intended to be limiting. In some embodiments, operation 507 illustrated in FIG. 5 may be performed according to the process 700.

In 701, the processing device 140 (e.g., the phase unwrapping module 408) may generate at least two initial unwrapped images corresponding to the at least two segmental phase images by performing phase unwrapping on the at least two segmental phase images, respectively. Each initial unwrapped image may correspond to one of the at least two segmental phase images, and may include a plurality of unwrapped phase elements. The phase unwrapping of each segmental phase image may be performed along one direction. For example, the phase unwrapping module 408 may perform phase unwrapping on the first segmental phase image along the X-axis direction, and perform phase unwrapping on the second segmental phase image along the Y-axis direction.

In some embodiments, the phase unwrapping module 408 may perform 1D phase unwrapping on 1D data segments of each segmental phase image, respectively, and may generate corresponding unwrapped 1D data segments of the each segmental phase image. In some embodiments, the phase unwrapping module 408 may combine one or more unwrapped 1D data segments to generate an initial unwrapped image with respect to the X-axis direction. In some embodiments, the phase unwrapping module 408 may combine one or more unwrapped 1D data segments to generate an initial unwrapped image with respect to the Y-axis direction. In some embodiments, the unwrapped 1D data segments may be combined based on locations of the 1D data segments in the initial phase image.

For example, for the first segmental phase image (e.g., the segmental phase image generated along the X-axis direction) as described in FIG. 5, the phase unwrapping module 408 may perform 1D phase unwrapping on the five 1D data segments, respectively, and generate five unwrapped 1D data segments. The phase unwrapping module 408 may combine the five unwrapped 1D data segments to generate an initial unwrapped image with respect to the X-axis direction. The five unwrapped 1D data segments may be combined based on locations of the five 1D data segments in the 2D phase image Q. As another example, for the second segmental phase image (e.g., the segmental phase image generated along the Y-axis direction) as described in FIG. 5, the phase unwrapping module 408 may perform 1D phase unwrapping on the six 1D data segments, respectively, and generate six unwrapped 1D data segments. The phase unwrapping module 408 may combine the six unwrapped 1D data segments to generate an initial unwrapped image with respect to the Y-axis direction. The six unwrapped 1D data segments may be combined based on locations of the six 1D data segments in the 2D phase image Q. Since the combination of 1D data segments may be performed on a single dimension (or direction) (e.g., the X-axis direction, or the Y-axis direction), the computational burden or complexity of the combination may be relatively small, which may almost not affect the efficiency of computation.

As described above, the phase unwrapping may be performed on one or more 1D data segments. The computational burden or complexity of the phase unwrapping may be proportional to the number (or count) of 1D data segments, but not the square of the number (or count) of phase elements in the (initial) phase image. For example, the computation amount may be proportional to the number of 1D data segments. In some embodiments, for the 2D phase image Q (i.e., the matrix A) described in FIG. 5, if the phase unwrapping is performed on the 2D phase image Q using a phase gradient minimum 2-norm algorithm, the computational burden or complexity of the phase unwrapping may be roughly proportional to the square of the number (or count) of phase elements (i.e., 16×16=256). Alternatively, if the phase unwrapping is performed on the 2D phase image Q using the method described in the present disclosure (e.g., the phase unwrapping is performed on 1D data segments of the 2D phase image Q), the computational burden or complexity of the phase unwrapping may be roughly proportional to the number (or count) of 1D data segments (i.e., 5+6=11). Therefore, the computational burden or complexity may be greatly reduced, and the efficiency of computation may be improved.

For a 2D phase image including n×n phase elements (n is a positive integer), if the phase unwrapping is performed on the 2D phase image using, for example, a phase gradient minimum 2-norm algorithm, the computational burden or complexity of the phase unwrapping may be roughly proportional to $n^2$. Alternatively, if the phase unwrapping is performed on the 2D phase image using the method described in the present disclosure, and if the 2D phase image does not include residual pixel(s), the computational burden or complexity of the phase unwrapping may be roughly proportional to 2n. The unwrapped 1D data segments may be combined to generate an initial unwrapped image, and the computational burden or complexity of the combination of the 1D data segments may be roughly proportional to n. Thus, the total computational burden or complexity may be roughly proportional to 3n (i.e., 2n+n). It should be noted that if n is a relatively large number, the computational burden or complexity may be greatly reduced and the efficiency of computation may be significantly improved.

In 703, the processing device 140 (e.g., the phase unwrapping module 408) may determine a set of optimized coefficients for each initial unwrapped image based on a condition associated with a difference between the at least two initial unwrapped images. The condition may refer to that the difference between the at least two initial unwrapped images is minimized. In some embodiments, different sets of optimized coefficients of different initial unwrapped images may be determined simultaneously if the difference between the at least two initial unwrapped images is minimized.

In some embodiments, the phase unwrapping module 408 may set a set of initial coefficients for each initial unwrapped image. The set of the initial coefficients of an initial unwrapped image may be represented as, for example, $A_1$, $A_2$, $A_3$, . . . , $A_n$; or $B_1$, $B_2$, $B_3$, . . . , $B_m$; or the like. The number (or count) of the set of initial coefficients of the initial unwrapped image may be the same as the number (or count) of 1D data segments of the corresponding segmental phase image. For example, for the first segmental phase image, if there are five 1D data segments, the corresponding initial unwrapped image may include five initial coefficients and may be represented as $A_1$, $A_2$, $A_3$, $A_4$, and $A_5$. As another example, for the second segmental phase image, if there are six 1D data segments, the corresponding initial unwrapped image may include six initial coefficients and may be represented as $B_1$, $B_2$, $B_3$, $B_4$, $B_5$, and $B_6$. In some embodiments, different sets of the initial coefficients corresponding to the at least two initial unwrapped images may be expressed in a matrix or an image. For example, two sets of initial coefficients of two initial unwrapped images may be expressed in an image (e.g., the dark points on the upper border and the left border of the binary image as illustrated in FIG. 14).

The phase unwrapping module 408 may determine a set of optimized coefficients for each initial unwrapped image by minimizing the difference between the at least two initial unwrapped images based on the set of initial coefficients. In some embodiments, the difference between the at least two initial unwrapped images may relate to a plurality of differences between each phase element of a first initial unwrapped image of the at least two initial unwrapped images and each corresponding element of a second initial unwrapped image of the at least two initial unwrapped images.

In some embodiments, the phase unwrapping module 408 may minimize the difference between the at least two initial unwrapped images using an objective function. The phase unwrapping module 408 may optimize the objective function by performing an iterative optimization based on the set of initial coefficients of the each initial unwrapped image. The iteration may terminate when a termination condition is satisfied, and the phase unwrapping module 408 may terminate the iterative optimization and determine the difference between the at least two initial unwrapped images is minimized. In some embodiments, the termination condition is when the objective function is equal to or less than a threshold. In some embodiments, the termination condition is when the objective function converges, or that a certain number (or count) of iterations are performed, or that the change of the values of the objective function in consecutive iterations is equal to or lower than a threshold.

Merely by way of example, the objective function may relate to a plurality of absolute values of differences between each phase element of two initial unwrapped images (e.g., a first initial unwrapped image and a second initial unwrapped image). For example, an objective function S1 may be expressed as min $\Sigma_{i=1}^{N} |M_i \times a_i - N_i \times b_i|$, wherein i refers to the ith phase element in the first initial unwrapped image and/or in the second initial unwrapped image; N refers to the number (or count) of phase elements in the first initial unwrapped image and/or in the second initial unwrapped image; $a_i$ refers to the phase value of the ith phase element in the first initial unwrapped image; $b_i$ refers to the phase value of the ith phase element in the second initial unwrapped image; $M_i$ refers to the initial coefficients of the ith phase element in the first initial unwrapped image; $N_i$ refers to the initial coefficients of the ith phase element in the second initial unwrapped image; "||" represents an operation of determining an absolute value; and "Σ" represents a summation operation. It should be noted that, different phase elements in the first (and/or second) initial unwrapped image may have the same or different initial coefficients. For example, $M_1$ and $M_2$ may refer to a same initial coefficient. As another example, $N_1$ and $N_2$ may refer to a same initial coefficient. As a further example, $M_1$ and $N_1$ may refer to a same initial coefficient.

Alternatively or additionally, the objective function may relate to a plurality of squared values of differences between each phase element of two initial unwrapped images. For example, an objective function S2 may be expressed as min $\Sigma_{i=1}^{N}(M_i \times a_i - N_i \times b_i)^2$, wherein "$(\ )^2$" represents a square operation.

To optimize the objective function (e.g., the objective function S1, the objective functions S2, or the like), the phase unwrapping module 408 may update and/or optimize the two sets of initial coefficients during the iterative optimization. When the objective function is optimized and/or minimized, two sets of optimized coefficients corresponding to the two initial unwrapped image may be determined. In some embodiments, at least two optimized coefficients may have the same value. Alternatively, in some embodiments, at least two optimized coefficients may have different values.

In 705, the processing device 140 (e.g., the phase unwrapping module 408) may determine at least two intermediate phase images based on the set of optimized coefficients and the at least two initial unwrapped images. Merely by way of example, for an initial unwrapped image, the phase unwrapping module 408 may multiply each phase element of the initial unwrapped image by its corresponding optimized coefficient to determine an intermediate phase image. Each intermediate phase image may correspond to one of the at least two segmental phase images. In some embodiments, one or more of the at least two intermediate phase images may include a plurality of unwrapped phase elements.

It should be noted that the above description of the process 700 is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. In some embodiments, the phase unwrapping module 408 may minimize the difference between the at least two initial unwrapped images using other objective functions unless the difference is minimized. In some embodiments, the phase unwrapping module 408 may designate the initial unwrapped images corresponding to the at least two segmental phase images as the intermediate phase images. Therefore, operations 703 and 705 may be omitted.

Figure 8:
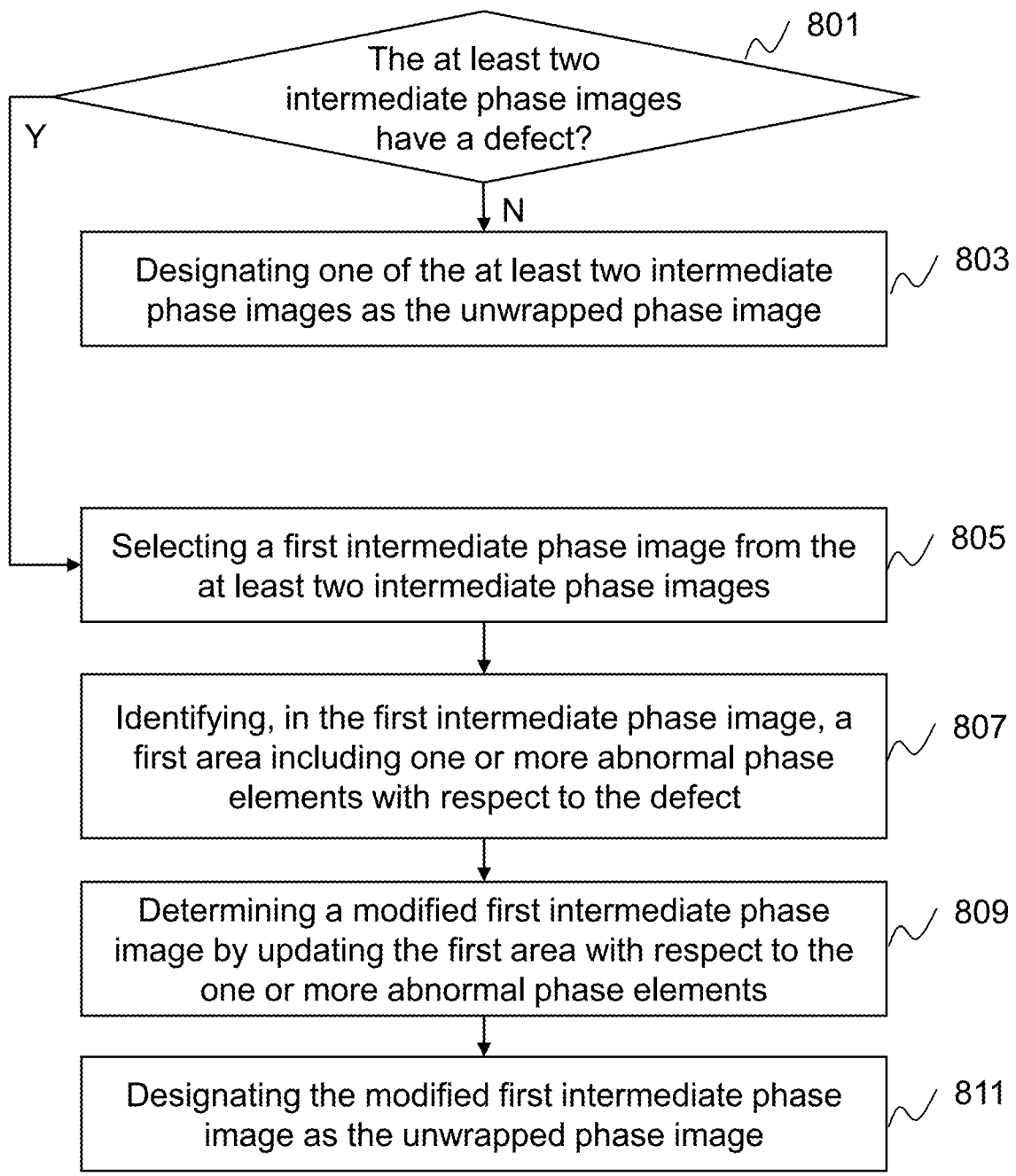
FIG. 8 is a flowchart illustrating an exemplary process for determining an unwrapped phase image according to some embodiments of the present disclosure.

FIG. 8 is a flowchart illustrating an exemplary process for determining an unwrapped phase image according to some embodiments of the present disclosure. In some embodiments, one or more operations of process 800 may be implemented in the MRI system 100 illustrated in FIG. 1. For example, the process 800 may be stored in the storage device 150 and/or the storage 220 in the form of instructions (e.g., an application), and invoked and/or executed by the processing device 140 (e.g., the processor 210 of the computing device 200 as illustrated in FIG. 2, the CPU 340 of the mobile device 300 as illustrated in FIG. 3, one or more modules of the processing device 140 as illustrated in FIG. 4, or the like). As another example, a portion of the process 800 may be implemented on the MRI scanner 110. The operations of the illustrated process presented below are intended to be illustrative. In some embodiments, the process 800 may be accomplished with one or more additional operations not described, and/or without one or more of the operations discussed. Additionally, the order in which the operations of the process 800 as illustrated in FIG. 8 and described below is not intended to be limiting. In some embodiments, operation 509 illustrated in FIG. 5 may be performed according to the process 800.

In 801, the processing device 140 (e.g., the unwrapped phase image determination module 410) may determine whether the at least two intermediate phase images have a defect. In some embodiments, the defect may be introduced due to discontinuity of phases in the intermediate phase image(s). In some embodiments, the defect may be relating to one or more residual pixels (e.g., the residual pixel(s) as described in FIG. 6). In some embodiments, the defect may be a laddering spreading along a direction of the at least two directions (see FIGS. 13A and 13B).

Merely by way of example, a row of phase elements in the initial phase image (e.g., the matrix A) may be segmented into two 1D data segments based on a residual pixel. The two 1D data segments may be performed phase unwrapping along the row direction (e.g., the X-axis direction) to generate two unwrapped 1D data segments, respectively. Thus, the two unwrapped 1D data segments may have phase mutation. Although the two unwrapped 1D data segments are optimized using the corresponding optimized coefficients, in some embodiments, the phase mutation between the two unwrapped 1D data segments cannot be eliminated, and then the defect may be generated. Since the defect spreads along the X-axis direction, the defect may also be referred to as "laddering" along the X-axis direction. Thus, an intermediate phase image with respect to the X-axis direction may include a defect along the X-axis direction. Similarly, a defect (or "laddering") along the Y-axis direction may be generated, and an intermediate phase image with respect to the Y-axis direction may include a defect along the Y-axis direction.

In response to a determination that the at least two intermediate phase images do not have the defect relating to the residual pixel(s), the process may proceed to 803. In 803, the processing device 140 (e.g., the unwrapped phase image determination module 410) may designate one of the at least two intermediate phase images as the unwrapped phase image. If the at least two intermediate phase images do not have the defect, the difference between the at least two intermediate phase images may be relatively small. Thus, the unwrapped phase image determination module 410 can select one of the at least two intermediate phase images as the unwrapped phase image.

In response to a determination that the at least two intermediate phase images have the defect relating to the residual pixel(s), the process may proceed to 805. In 805, the processing device 140 (e.g., the unwrapped phase image determination module 410) may select a first intermediate phase image from the at least two intermediate phase images. The first intermediate phase image may be any one of the at least two intermediate phase images, for example, an intermediate phase image with respect to the X-axis direction, an intermediate phase image with respect to the Y-axis direction, etc.

In 807, the processing device 140 (e.g., the unwrapped phase image determination module 410) may identify a first area including one or more abnormal phase elements with respect to the defect in the first intermediate phase image. The abnormal phase elements may be related to the defect. In other words, the abnormal phase elements may be phase elements having the defect.

In 809, the processing device 140 (e.g., the unwrapped phase image determination module 410) may determine a modified first intermediate phase image by updating the first area with respect to the one or more abnormal phase elements. In some embodiments, the unwrapped phase image determination module 410 may determine the modified first intermediate phase image by replacing the one or more abnormal phase elements in the first area of the first intermediate phase image with one or more corresponding phase elements in a second intermediate phase image of the at least two intermediate phase images. The second intermediate phase image may be one of the at least two intermediate phase images other than the first intermediate phase image. For example, if the first intermediate phase image is the intermediate phase image with respect to the X-axis direction, the second intermediate phase image may be the intermediate phase image with respect to the Y-axis direction. As another example, if the first intermediate phase image is the intermediate phase image with respect to the Y-axis direction, the second intermediate phase image may be the intermediate phase image with respect to the X-axis direction. Because the defects (e.g., laddering) in the first intermediate phase image and the second intermediate phase image are in different directions, the phase element(s) of the second intermediate phase image corresponding to the abnormal phase element(s) of the first intermediate phase image may not have the defect. Thus, the defect in the modified first intermediate phase image may be reduced or eliminated.

In 811, the processing device 140 (e.g., the unwrapped phase image determination module 410) may designate the modified first intermediate phase image as the unwrapped phase image.

It should be noted that the above description of the process 800 is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. In some embodiments, a first intermediate phase image may include a plurality of defects. In some embodiments, the processing device 140 may eliminate or reduce a portion of the defects using a second intermediate phase image and the other portions of the defects using a third intermediate phase image. Alternatively, the processing device 140 may eliminate or reduce all defects using a second intermediate phase image.

Figure 9:
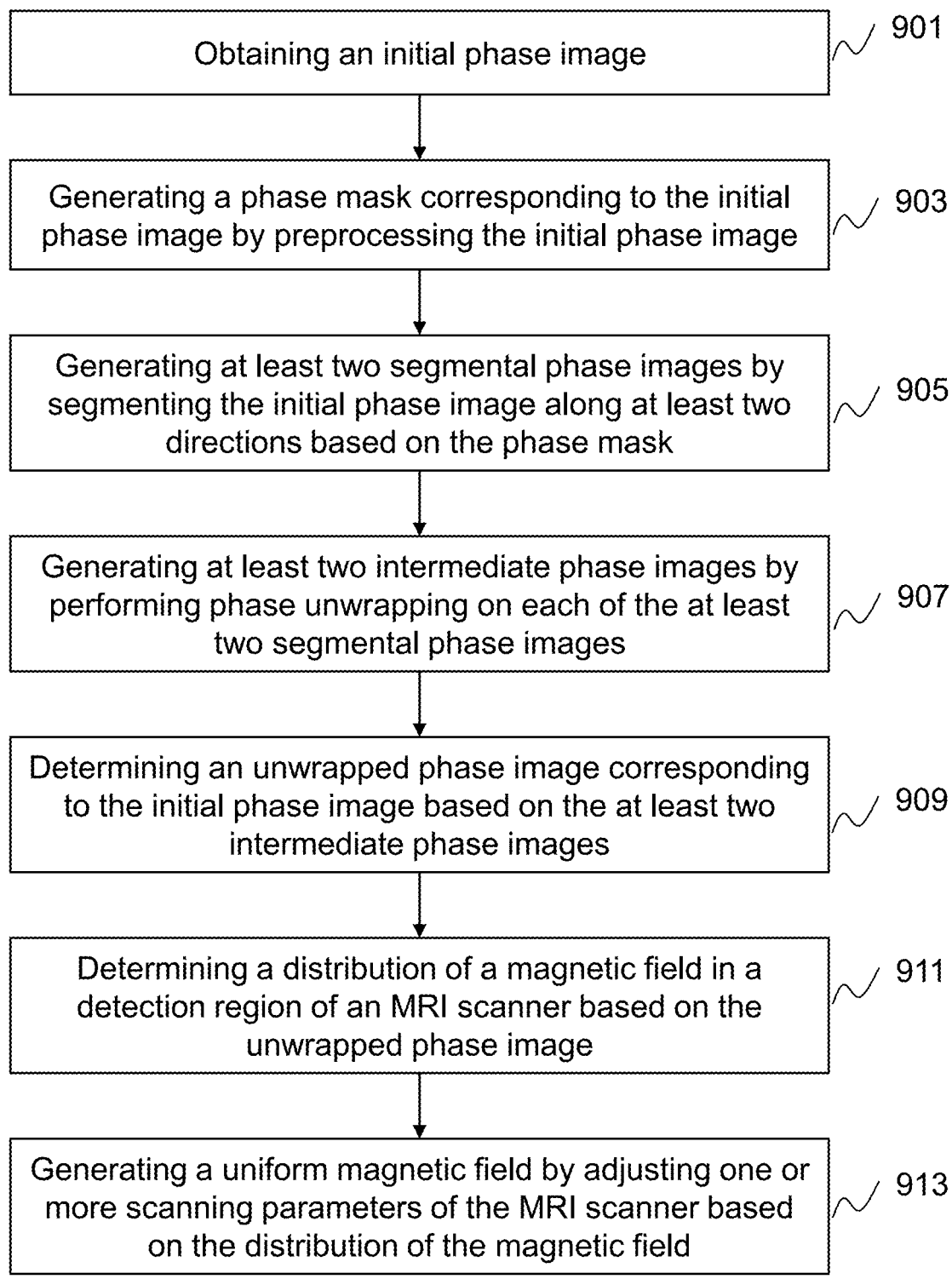
FIG. 9 is a flowchart illustrating an exemplary process for generating a uniform magnetic field according to some embodiments of the present disclosure.

FIG. 9 is a flowchart illustrating an exemplary process for generating a uniform magnetic field according to some embodiments of the present disclosure. In some embodiments, one or more operations of process 900 may be implemented in the MRI system 100 illustrated in FIG. 1. For example, the process 900 may be stored in the storage device 150 and/or the storage 220 in the form of instructions (e.g., an application), and invoked and/or executed by the processing device 140 (e.g., the processor 210 of the computing device 200 as illustrated in FIG. 2, the CPU 340 of the mobile device 300 as illustrated in FIG. 3, one or more modules in the processing device 140 as illustrated in FIG. 4, or the like). As another example, a portion of the process 900 may be implemented on the MRI scanner 110. The operations of the illustrated process presented below are intended to be illustrative. In some embodiments, the process 900 may be accomplished with one or more additional operations not described, and/or without one or more of the operations discussed. Additionally, the order in which the operations of the process 900 as illustrated in FIG. 9 and described below is not intended to be limiting.

In 901, the processing device 140 (e.g., the acquisition module 402) may obtain an initial phase image. In 903, the processing device 140 (e.g., the preprocessing module 404) may generate a phase mask corresponding to the initial phase image by preprocessing the initial phase image. In 905, the processing device 140 (e.g., the segmentation module 406) may generate at least two segmental phase images by segmenting the initial phase image along at least two directions based on the phase mask. In 907, the processing device 140 (e.g., the phase unwrapping module 408) may generate at least two intermediate phase images by performing phase unwrapping on each of the at least two segmental phase images. In 909, the processing device 140 (e.g., the unwrapped phase image determination module 410) may determine an unwrapped phase image corresponding to the initial phase image based on the at least two intermediate phase images. Operations 901 to 909 may be performed in a manner similar to operations 501 to 509, and the descriptions thereof are not repeated here.

In 911, the processing device 140 (e.g., the field distribution determination module 412) may determine a distribution of a magnetic field (e.g., a main magnetic field) in the detection region of the MRI scanner 110 based on the unwrapped phase image. In some embodiments, the magnetic field may be generated by a superconducting magnet. In some embodiments, the magnetic field may be non-uniform due to the entrance of the subject into the detection region, the instability of the MRI system 100, or the like. The distribution information of the magnetic field may include the uniformity of the magnetic field, the intensity of the magnetic field, or the like, or any combination thereof. In some embodiments, the field distribution determination module 412 may determine the distribution of the magnetic field according to the phase values of the phase elements of the unwrapped phase image. In some embodiments, the field distribution determination module 412 may determine whether the magnetic field is uniform. In response to a determination that the magnetic field is non-uniform, the process 900 may proceed to 913.

In 913, the processing device 140 (e.g., the adjustment module 414) may generate a uniform magnetic field by adjusting one or more scanning parameters of the MRI scanner 110 based on the distribution of the magnetic field. In some embodiments, the MRI scanner 110 may cause the superconducting magnet to generate a uniform magnetic field based on the adjusted scanning parameter(s). Further, under the coordinated action of the generated uniform magnetic field, the gradient magnetic field, and the RF pulses, new MR signals relating to the subject may be generated.

It should be noted that the above description of the process 900 is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. In some embodiments, operation 913 may be omitted. If the field distribution determination module 412 determines the magnetic field is uniform, the scanning parameter(s) may not need to be adjusted.

FIG. 11 shows an exemplary initial phase image according to some embodiments of the present disclosure. The initial phase image 1100 may be a 2D phase image. The first dimension may be the X-axis direction. The second dimension may be the Y-axis direction. As illustrated in FIG. 11, the initial phase image has phase mutation (also referred to as wrapping artifacts) that are marked with solid circles along the X-axis direction and/or the Y-axis direction. In some embodiments, the phase mutation (or the wrapping artifacts) may be caused by noises and/or phase wrapping.

Thus, a phase unwrapping may be performed to reduce or eliminate the phase mutation (i.e., the wrapping artifacts).

Figure 12:
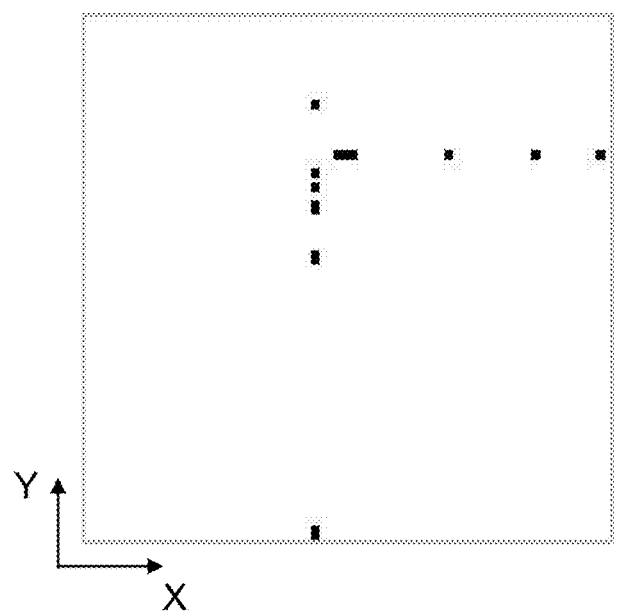
FIG. 12 shows an exemplary phase mask according to some embodiments of the present disclosure.

FIG. 12 shows an exemplary phase mask according to some embodiments of the present disclosure. The phase mask was generated based on the initial phase image in FIG. 11. The phase mask was generated according to one or more operations of process 600 described above, and is not repeated here. The phase mask may include multiple elements whose values are 0 (shown as black points in FIG. 12). For illustration purposes, each element with the value 0 may correspond to a residual pixel in the initial phase image in FIG. 11. The residual pixels may include or be phase elements that have the phase mutation in the initial phase image. Using the phase mask, the residual pixels may be removed from the initial phase image, which may improve the reliability of phase unwrapping.

In some embodiments, the initial phase image may be segmented into two segmental phase images based on the phase mask. For example, the initial phase image may be segmented along the X-axis direction based on the phase mask to generate multiple 1D data segments. The multiple 1D data segments may form a segmental phase image with respect to the X-axis direction (also referred to as a first segmental phase image). As another example, the initial phase image may be segmented along the Y-axis direction based on the phase mask to generate multiple 1D data segments. The multiple 1D data segments may form a segmental phase image with respect to the Y-axis direction (also referred to as a second segmental phase image). More descriptions regarding the segmentation of the initial phase image may be found elsewhere in the present disclosure (e.g., operation 505 of the process 500 and the descriptions thereof).

Figure 13A:
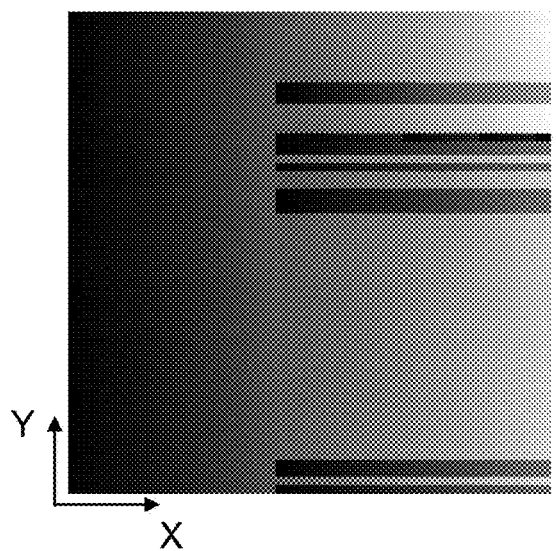
FIGS. 13A and 13B show two initial unwrapped images according to some embodiments of the present disclosure.
Figure 13B:
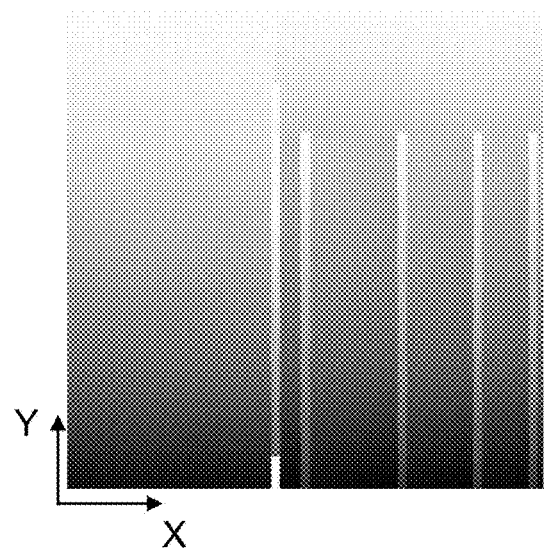

FIGS. 13A and 13B show two initial unwrapped images according to some embodiments of the present disclosure. The initial unwrapped image illustrated in FIG. 13A (also referred to as a first initial unwrapped image) may be generated by performing phase unwrapping on the first segmental phase image described in FIG. 12 along the X-axis direction. Specifically, the phase unwrapping may be performed on the multiple 1D data segments of the first segmental phase image, respectively. The initial unwrapped image illustrated in FIG. 13B (also referred to as a second initial unwrapped image) may be generated by performing phase unwrapping on the second segmental phase image described in FIG. 12 along the Y-axis direction. Specifically, the phase unwrapping may be performed on the multiple 1D data segments of the second segmental phase image, respectively.

As shown in FIGS. 13A and 13B, the variations of brightness in the initial unwrapped images indicate the variations of phase values of the initial unwrapped image. The brighter the initial unwrapped images are, the larger the phase values of the initial unwrapped images are. The brightness in the first initial unwrapped image is different from that in the second initial unwrapped image. Accordingly, the phase values of the first initial unwrapped image may be different from that of the second initial unwrapped image due to the phase unwrapping along different directions. As shown in FIG. 13A, the first initial unwrapped image includes multiple relatively dark phase segments, each of which may correspond to one 1D data segment of the first segmental phase image. The relatively dark phase elements may be caused due to the removed residual pixels. As shown in FIG. 13B, the second initial unwrapped image includes multiple relatively bright phase segments, each of which may correspond to one 1D data segment of the second segmental phase image. The relatively bright phase elements may be caused due to the removed residual pixels. The relatively dark phase segments and the relatively bright phase segments may be regarded as abnormal phase segments affected by the removed residual pixels.

In some embodiments, to reduce or eliminate the abnormal phase segments in FIGS. 13A and 13B, the two initial unwrapped images may be modified and/or optimized. In some embodiments, a set of initial coefficients may be set for each initial unwrapped image. A first set of initial coefficients correspond to the first initial unwrapped image, and a second set of initial coefficients correspond to the second initial unwrapped image. In some embodiments, the first set of initial coefficients and the second set of initial coefficients may be expressed in a same matrix. FIG. 14 shows a binary image illustrating positions of the initial coefficients corresponding to the two initial unwrapped images. The positions of the initial coefficients are represented as a plurality of dark points, including the dark points on the upper border and the left border of the binary image, and the dark points inside the binary image. As shown in FIG. 14, the positions of the initial coefficients correspond to the first phase elements of 1D data segments of the first and second segmental phase images. In some embodiments, the initial coefficients may be optimized by minimizing the difference between the two initial unwrapped images to determine optimized coefficients. The optimized coefficients may be used to modify the initial unwrapped image(s) to generate intermediate phase image(s).

FIGS. 15A and 15B show two intermediate phase images according to some embodiments of the present disclosure. The intermediate phase image illustrated in FIG. 15A (also referred to as a first intermediate phase image) is generated based on the first initial unwrapped image and its corresponding optimized coefficients described in FIG. 14. The intermediate phase image illustrated in FIG. 15B (also referred to as a second intermediate phase image) is generated based on the second initial unwrapped image and its corresponding optimized coefficients described in FIG. 14. As shown in FIGS. 15A and 15B, the brightness in the first intermediate phase image is similar to that in the second intermediate phase image, which indicates the phase values between the first intermediate phase image and the second intermediate phase image are substantially the same. Furthermore, the abnormal phase segments in FIGS. 13A and 13B are reduced or nearly eliminated.

Figure 16:
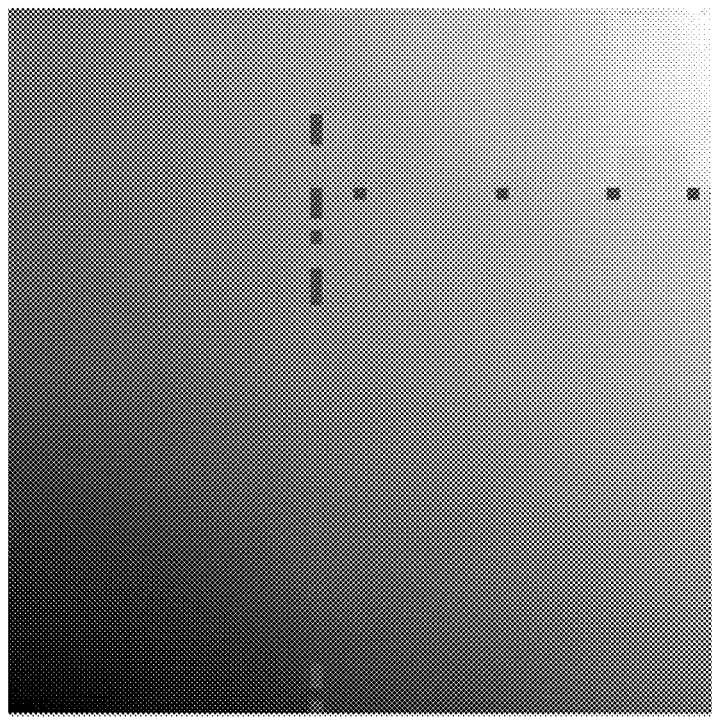
FIG. 16 shows an unwrapped phase image determined based on the intermediate phase images shown in FIGS. 15A and 15B.

However, the two intermediate phase images both have defects (also referred to as "laddering"). The first intermediate phase image has a defect (in the dashed box) spreading along the X-axis direction. The second intermediate phase image has two defects (in the dashed boxes) spreading along the Y-axis direction. In some embodiments, one of the two intermediate phase image may be modified to reduce or eliminate the defect(s). The modified intermediate phase image may also be referred to as an unwrapped phase image. More descriptions regarding the determination of the unwrapped phase image may be found elsewhere in the present disclosure (e.g., FIG. 8 and the descriptions thereof). FIG. 16 shows an unwrapped phase image determined based on the intermediate phase images shown in FIGS. 15A and 15B. As illustrated in FIG. 16, the unwrapped phase image has no defect(s).

In the present disclosure, the initial phase image may be segmented into at least two segmental phase images along at least two directions based on a phase mask. The segmental phase image(s) may include one or more 1D data segments. The phase unwrapping of each segmental phase image may be performed along one direction. Specifically, the phase unwrapping of each segmental phase image may be performed on its corresponding 1D data segments, which may greatly reduce the amount of computation, and improve the efficiency of computation. What's more, residual pixels may be removed from the initial phase image, which may enhance the stability and reliability of the phase unwrapping.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A non-transitory computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system for phase unwrapping in magnetic resonance imaging (MRI) comprising:
    at least one storage device storing a set of instructions; and
    at least one processor in communication with the storage device, wherein when executing the set of instructions, the at least one processor is configured to cause the system to:
        obtain an initial phase image including a plurality of phase elements, at least one of the plurality of phase elements being wrapped;
        generate, based on phase differences between the plurality of phase elements, a phase mask corresponding to the initial phase image by preprocessing the initial phase image;
        generate at least two segmental phase images by segmenting the initial phase image along at least two directions based on the phase mask;
        generate at least two intermediate phase images by performing phase unwrapping on each of the at least two segmental phase images, respectively; and
        determine an unwrapped phase image corresponding to the initial phase image based on the at least two intermediate phase images.

2. The system of claim 1, wherein to generate a phase mask corresponding to the initial phase image by preprocessing the initial phase image, the at least one processor is further configured to cause the system to:
    determine a plurality of residual values for the plurality of phase elements, each residual value corresponding to a phase element and relating to one or more phase differences between the phase element and one or more phase elements next to the phase element;
    determine the one or more residual pixels based on the plurality of residual values; and
    generate the phase mask corresponding to the initial phase image based on the one or more residual pixels.

3. The system of claim 2, wherein to determine the one or more residual pixels based on the plurality of residual values, the at least one processor is further configured to cause the system to:
    designate a candidate phase element next to a determined residual pixel as a residual pixel, the candidate phase element being a phase element that is involved in a determination of the residual value of the determined residual pixel.

4. The system of claim 2, wherein to generate a phase mask corresponding to the initial phase image by preprocessing the initial phase image, the at least one processor is further configured to cause the system to:
    obtain an amplitude image corresponding to the initial phase image, the amplitude image including a plurality of amplitude elements, each amplitude element of the amplitude image corresponding to a pixel or voxel and having an amplitude value, each amplitude element of the amplitude image corresponding to a phase element of the initial phase image;
    determine one or more background amplitude elements from the amplitude image, an amplitude value of each background amplitude element being lower than a threshold; and
    update the initial phase image by designating phase values of one or more phase elements corresponding to the determined one or more background amplitude elements as 0.

5. The system of claim 1, wherein to generate at least two intermediate phase images by performing phase unwrapping on each of the at least two segmental phase images, the at least one processor is further configured to cause the system to:
    generate at least two initial unwrapped images corresponding to the at least two segmental phase images by performing phase unwrapping on the at least two segmental phase images, respectively;
    determine a set of optimized coefficients for each initial unwrapped image based on a condition associated with a difference between the at least two initial unwrapped images; and
    determine the at least two intermediate phase images based on the set of optimized coefficients and the at least two initial unwrapped images.

6. The system of claim 5, wherein to determine a set of optimized coefficients for each initial unwrapped image, the at least one processor is further configured to cause the system to:
    set a set of initial coefficients for the each initial unwrapped image; and
    determine the set of optimized coefficients for the each initial unwrapped image by minimizing the difference between the at least two initial unwrapped images based on the set of initial coefficients of the each initial unwrapped image.

7. The system of claim 1, wherein to determine an unwrapped phase image corresponding to the initial phase image based on the at least two intermediate phase images, the at least one processor is further configured to cause the system to:
    determine that the at least two intermediate phase images do not have a defect relating to the one or more residual pixels;
    in response to a determination that the at least two intermediate phase images do not have a defect relating to the one or more residual pixels, designate one of the at least two intermediate phase images as the unwrapped phase image.

8. The system of claim 1, wherein to determine an unwrapped phase image corresponding to the initial phase image based on the at least two intermediate phase images, the at least one processor is further configured to cause the system to:

determine that at least one of the at least two intermediate phase images has a defect relating to the one or more residual pixels;

in response to a determination that at least one of the at least two intermediate phase images has a defect relating to at least one of the one or more residual pixels, select a first intermediate phase image from the at least two intermediate phase images;

identify, in the first intermediate phase image, a first area including one or more abnormal phase elements with respect to the defect;

determine a modified first intermediate phase image by updating the first area with respect to the one or more abnormal phase elements; and designate the modified first intermediate phase image as the unwrapped phase image.

9. The system of claim 8, wherein the defect is a laddering spreading along a direction of the at least two directions.

10. The system of claim 8, wherein to determine a modified first intermediate phase image by updating the first area with respect to the one or more abnormal phase elements, the at least one processor is further configured to cause the system to:

determine the modified first intermediate phase image by replacing the one or more abnormal phase elements in the first area of the first intermediate phase image with one or more corresponding phase elements in a second intermediate phase image of the at least two intermediate phase images.

11. The system of claim 1, wherein the initial phase image is generated according to magnetic resonance (MR) signals collected by an MRI scanner.

12. The system of claim 11, wherein the at least one processor is further configured to cause the system to:

determine a distribution of a magnetic field in a detection region of the MRI scanner based on the unwrapped phase image.

13. The system of claim 1, wherein the at least two directions include a phase encoding direction and a frequency encoding direction.

14. The system of claim 13, wherein the at least two directions further include a slice selection direction or a direction corresponding to a time dimension.

15. A method of performing phase unwrapping, the method being implemented on a computing device including a storage device and at least one processor, the method comprising:

obtaining an initial phase image including a plurality of phase elements, at least one of the plurality of phase elements being wrapped;

generating, based on phase differences between the plurality of phase elements, a phase mask corresponding to the initial phase image by processing the initial phase image;

generating at least two segmental phase images by segmenting, along at least two directions, the initial phase image into a plurality of line-segments based on the phase mask, respectively;

generating at least two intermediate phase images by performing phase unwrapping on each of the at least two segmental phase images, respectively; and determining an unwrapped phase image corresponding to the initial phase image based on the at least two intermediate phase images.

16. The method of claim 15, wherein generating a phase mask corresponding to the initial phase image by preprocessing the initial phase image comprises:

determining a plurality of residual values for the plurality of phase elements, each residual value corresponding to a phase element and relating to one or more phase differences between the phase element and one or more phase elements next to the phase element;

determining the one or more residual pixels based on the plurality of residual values; and generating the phase mask corresponding to the initial phase image based on the one or more residual pixels.

17. The method of claim 15, wherein determining an unwrapped phase image corresponding to the initial phase image based on the at least two intermediate phase images comprises:

determining at least one of the at least two intermediate phase images including a defect relating to the one or more residual pixels;

selecting a first intermediate phase image from the at least two intermediate phase images;

identifying, in the first intermediate phase image, a first area including one or more abnormal phase elements with respect to the defect;

determining a modified first intermediate phase image by updating the first area with respect to the one or more abnormal phase elements; and designating the modified first intermediate phase image as the unwrapped phase image.

18. The method of claim 15, wherein the at least two directions include a phase encoding direction and a frequency encoding direction.

19. The method of claim 15, further comprising:

performing phase unwrapping along a slice selection direction or a direction corresponding to a time dimension.

20. A non-transitory computer-readable medium, comprising at least one set of instructions, wherein when executed by at least one processor of a computing device, the at least one set of instructions cause the at least one processor to effectuate a method comprising:

obtaining an initial phase image including a plurality of phase elements, at least one of the plurality of phase elements being wrapped;

generating, based on phase differences between the plurality of phase elements, a phase mask corresponding to the initial phase image by preprocessing the initial phase image;

generating at least two segmental phase images by segmenting the initial phase image along at least two directions based on the phase mask;

generating at least two intermediate phase images by performing phase unwrapping on each of the at least two segmental phase images, respectively; and determining an unwrapped phase image corresponding to the initial phase image based on the at least two intermediate phase images.

* * * * *